United States Patent
Suckling et al.

(10) Patent No.: US 9,512,972 B2
(45) Date of Patent: Dec. 6, 2016

(54) HEADLIGHT SYSTEM INCORPORATING ADAPTIVE BEAM FUNCTION

(71) Applicant: Sharp Kabushiki Kaisha, Osaka (JP)

(72) Inventors: James Rowland Suckling, Surrey (GB); David James Montgomery, Oxford (GB); Koji Takahashi, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 52 days.

(21) Appl. No.: 14/365,800

(22) PCT Filed: Dec. 21, 2012

(86) PCT No.: PCT/JP2012/008219
§ 371 (c)(1),
(2) Date: Jun. 16, 2014

(87) PCT Pub. No.: WO2013/094222
PCT Pub. Date: Jun. 27, 2013

(65) Prior Publication Data
US 2014/0362600 A1 Dec. 11, 2014

(30) Foreign Application Priority Data
Dec. 22, 2011 (GB) .................................. 1122183.5

(51) Int. Cl.
*F21S 8/10* (2006.01)
*F21V 13/02* (2006.01)
(Continued)

(52) U.S. Cl.
CPC .............. *F21S 48/1225* (2013.01); *F21K 9/64* (2016.08); *F21S 48/1145* (2013.01);
(Continued)

(58) Field of Classification Search
CPC .................................................... F21S 48/1747
(Continued)

(56) References Cited

U.S. PATENT DOCUMENTS

| 4,722,037 A | 1/1988 | Davis |
| 6,736,524 B2 | 5/2004 | Albou |

(Continued)

FOREIGN PATENT DOCUMENTS

| DE | 10 2004 060 475 A1 | 7/2006 |
| DE | 10 2010 028 949 A1 | 11/2011 |

(Continued)

OTHER PUBLICATIONS

International Search Report for corresponding International Application No. PCT/JP2012/008219 mailed Mar. 26, 2013.
(Continued)

*Primary Examiner* — Nimeshkumar Patel
*Assistant Examiner* — Christopher Raabe
(74) *Attorney, Agent, or Firm* — Renner, Otto, Boisselle & Sklar, LLP

(57) ABSTRACT

A light source system comprising projection optics, which are capable of producing a far-field image of a light source. The light source comprises a fluorescent medium that when illuminated by light from laser emitters of a first waveband emits light of a second or more wavebands of longer wavelength. The resulting light emission produces a color perceived as white. The light source is illuminated by a plurality of laser emitters arranged to illuminate the light source in an array-like manner. Control of the output of one or more of the laser emitters results in a variation of the spatial emission distribution from the light source and hence a variation of the far-field beam spot distribution via non-mechanical means.

19 Claims, 30 Drawing Sheets

(51) Int. Cl.
*F21V 13/14* (2006.01)
*F21V 8/00* (2006.01)
*G02B 6/42* (2006.01)
*H01S 5/00* (2006.01)
*H01S 5/40* (2006.01)
*F21W 111/02* (2006.01)
*F21Y 101/00* (2016.01)

(52) U.S. Cl.
CPC ....... *F21S 48/1154* (2013.01); *F21S 48/1241* (2013.01); *F21S 48/1705* (2013.01); *F21S 48/1742* (2013.01); *F21S 48/1747* (2013.01); *F21V 13/02* (2013.01); *F21V 13/14* (2013.01); *G02B 6/0008* (2013.01); *G02B 6/4216* (2013.01); *G02B 6/4296* (2013.01); *B60Q 2400/50* (2013.01); *F21W 2111/02* (2013.01); *F21Y 2101/00* (2013.01); *F21Y 2115/30* (2016.08); *G02B 6/4204* (2013.01); *H01S 5/005* (2013.01); *H01S 5/4025* (2013.01)

(58) Field of Classification Search
USPC .................................................... 362/84, 510
See application file for complete search history.

(56) References Cited

U.S. PATENT DOCUMENTS

| | | | |
|---|---|---|---|
| 7,382,091 B2* | 6/2008 | Chen | H01L 33/507 257/E33.072 |
| 7,654,712 B2 | 2/2010 | Takeda et al. | |
| 2005/0105301 A1* | 5/2005 | Takeda | F21S 48/1154 362/545 |
| 2009/0296018 A1* | 12/2009 | Harle | G01M 11/062 349/61 |
| 2011/0148280 A1* | 6/2011 | Kishimoto | F21S 48/1154 313/483 |
| 2011/0194302 A1 | 8/2011 | Kishimoto et al. | |
| 2011/0248624 A1* | 10/2011 | Kishimoto | C09K 11/0883 313/483 |
| 2011/0249460 A1 | 10/2011 | Kushimoto | |
| 2012/0026721 A1* | 2/2012 | Kurt | F21K 9/56 362/84 |
| 2012/0051074 A1 | 3/2012 | Takahashi | |
| 2013/0058114 A1 | 3/2013 | Reiners | |
| 2013/0201708 A1 | 8/2013 | Takahashi | |
| 2013/0258689 A1 | 10/2013 | Takahira et al. | |
| 2013/0265561 A1 | 10/2013 | Takahira et al. | |

FOREIGN PATENT DOCUMENTS

| | | |
|---|---|---|
| EP | 2063170 A2 | 5/2009 |
| JP | 2010-232044 | 10/2010 |
| JP | 2011-100561 | 5/2011 |
| JP | 2011-134619 | 7/2011 |
| JP | 2011-204406 | 10/2011 |
| JP | 2011-243371 | 12/2011 |
| JP | 2012-074354 | 4/2012 |
| JP | 2013-161738 | 8/2013 |
| JP | 2014-007093 | 1/2014 |
| WO | WO 2006/096467 A2 | 9/2006 |
| WO | WO 2009/131126 A1 | 10/2009 |

OTHER PUBLICATIONS

Form PCT/ISA/237 for corresponding International Application No. PCT/JP2012/008219 dated Mar. 26, 2013.

* cited by examiner

PRIOR ART

PRIOR ART

PRIOR ART

PRIOR ART

HEADLIGHT SYSTEM INCORPORATING ADAPTIVE BEAM FUNCTION

TECHNICAL FIELD

The present invention relates to a light source system that may, for example, be used in a headlight system for the provision of an illumination pattern on the road which may be adapted to best suit driving conditions. It also relates to a vehicle including such a headlight system.

BACKGROUND ART

The application of lighting to the automotive industry is well known. The original electric light sources were filament bulbs which offered high luminance from a small source. Improvements in light source design led to halogen type filament bulbs, high intensity discharge (HID) bulbs or high brightness light emitting diodes (LED). These offer improvement in terms of luminance and energy use over preceding filament bulbs. In order to apply these light sources to automotive front lighting and realise the beam spot distributions required by regulatory bodies, such as the United Nations Economic Commission for Europe (UN-ECE) or Federal Motor Vehicle Safety Standards (FMVSS), for the U.S.A, modification of the output beam to form specific beam spot distributions on the road is necessary. For projector headlights this requires removal of a portion of the light from the projected beam which ultimately forms the beam spot, to create a dipped beam. The dipped beam is necessary to avoid causing glare to oncoming road users. By necessity, the dipped beam also creates a restricted view of the road due to restricted illumination of the same. The removal of light is performed by a shield, which is inserted into the light path thereby causing a reduction in optical efficiency of the projector headlight.

The filament and discharge light sources provide no means for modification of the output from the source. Therefore, a shield is the only method of providing the dipped beam spot distribution pattern. To switch between a dipped beam and a driving beam, the beam pattern that is necessary for better visibility, either two headlights must be provided, one to create the dipped beam and the other to create the driving beam, or a mechanical switching mechanism must be provided. When the driving beam is desired, the mechanical switching mechanism removes the shield from the projected beam profile allowing all light to exit the projector headlight unit unimpeded.

The provision of only a dipped beam distribution, or of only a driving beam distribution, has limitations in terms of road user safety by not providing simultaneous optimal illumination of the road and minimal glare to other road users. This can be improved upon by the addition of an adaptive element to the projected headlight beam. However, all methods of creating an adaptive beam spot from a single projector unit require mechanical moving components within the headlight unit. This has a limitation on cost reduction and reliability of the headlight over the course of its lifetime. Alternative methods of provision of an adaptive beam spot require multiple light source units, which increases the headlight cost, and which also have a large volume, this having implications for pedestrian safety in the event of a collision.

Laser based light sources offer advantage over existing light sources due to the ability to control the emission from the laser diode effectively using optics with a much reduced size, and therefore, weight. This control ability stems from the small emission area and restricted angular distribution of the laser diode. The light emitted from laser diodes is often illuminated onto a fluorescent material to convert from the first wavelength to a second wavelength, which is predominantly white. The light source created is very small and can be used more efficiently with headlight projection optics.

The following background art describes the use of lasers in automotive headlight units:

US 2011-0194302 A1 (Sharp, 11 Aug. 2011); an illustration of this patent is shown in FIG. 1. This patent discloses a rectangular parallelepiped light emitting element 11 which is formed from a fluorescent material. The light emitting element 11 is excited by light from multiple laser chips 12 in a group 15. The light is concentrated to the light emitting element 11 by light guide irradiation members 13. The excitation light illuminates the light emitting element 11 via an array-like arrangement of the light guide irradiation members 13. The light emitted from the light emitting element 11 is collimated by a reflecting mirror 14 to form a headlight beam spot.

JP 2010-232044A (Stanley Electric, published 14 Oct. 2010); an illustration of this patent is shown in FIG. 2. This patent discloses a lamp for a vehicle 21 consisting of a plurality of light emitting diode (LED) light sources 22, a phosphor 23 and a shade 24. The phosphor 23 emits white light in response to excitation from a laser light source. The light distribution created by the combination of the LED 22, phosphor 23 and shade 24 is imaged through a convex lens 25 to form a dipped beam spot distribution on the road. The invention provides for a dipped beam spot distribution only from this light source.

JP 2011-134619 A (Stanley Electric, published 7 Jul. 2011); an illustration of this patent is shown in FIG. 3. This patent discloses the use of a solid state light source 31 which can be scanned across a fluorescent material layer 32 to form a controllable light source, emitting white or coloured light. The scanning is performed by a moveable reflective method 33, for example mirror. The light is then projected by means of an optical system 34, for example a lens. A similar configuration of light source is disclosed in EP 2,063,170 (Audi AG, 27 May 2009)

U.S. Pat. No. 6,736,524B2 (Valeo Vision, published as US 2003/0223246 on 4 Dec. 2003); an illustration of this patent is shown in FIG. 4. This patent discloses a projector headlight unit which is designed to emit a dipped beam spot profile onto the road. A secondary light source 41, comprising an optical distribution element 42, is incorporated into the headlight at the focal point of the principal lens 43. A laser diode 44 emits infra-red light, which is distributed by an optical distribution element 42 to produce a secondary light beam. The optical distribution element 42 is shaped in a similar fashion to the dipped beam profile by its application to the obscuring part 45. The obscuring part 45 serves the same function as the previously described shield. The secondary, infra-red light beam may be used for illuminating axially in front of the projected dipped beam.

U.S. Pat. No. 7,654,712 B2 (Koito Manufacturing, published as US 2008/0013329 on 17 Jan. 2008); an illustration of this patent is shown in FIG. 5. This patent discloses a lamp module 51 formed from multiple elements formed from a fluorescent substance 52 excited by individual light emission parts 53 to emit white light. The fluorescent emission from the fluorescent substance 52 is collimated by a plurality of micro lenses 54. This light can then be projected by another lens to form a beam spot. This has the capability to form an adaptive beam spot.

WO 2009/131126 (Koito Manufacturing Co., Ltd, 29 Oct. 2009) proposes a "lighting fixture" for a vehicle, in which a semiconductor light-emitting element illuminates a fluorescent material via a wavelength-selecting filter. The wavelength-selecting filter transmits light from the light-emitting element, but reflects light of the wavelengths re-emitted by the fluorescent material. The light from the fluorescent material, and any unabsorbed component of the original radiation from the light-emitting element, are then emitted. In one embodiment three separate light sources are provided to provide increased output intensity, but these light sources cannot be operated independently from one another. Moreover, each light source illuminates the same region of the phosphor and so each light source provides the same illumination pattern as one another. Furthermore, the phosphor surface is collinear with the optical axis, resulting in poor reproduction of any distribution upon the phosphor in the far field.

JP 2011-204406 (Caravell Co Ltd, 13 Oct. 2011) proposes an illumination device for a motor vehicle, for example for a taillight. An LED illuminates a "fluorescent diffuser"—for example the LED may emit blue light, and the fluorescent diffuser may convert this into red light. It is however not possible to vary the output illumination pattern.

U.S. Pat. No. 4,722,037 (Davis, 26 Jan. 1988) is directed to the use of a holographic optical element that provides different diffraction effects on light from two different light sources of different spectral characteristics. Two separate light sources with different spectral characteristics are provided for illuminating an holographic element—and different output patterns can be obtained depending on which of the light sources is illuminated.

CITATION LIST

Patent Literature

PTL 1: US 2011/0194302 (Sharp Kabushiki Kaisha, 11 Aug. 2011);
PTL 2: JP-A-2010-232044 (Stanley Electric, 14 Oct. 2010);
PTL 3: JP-A-2011-134619 (Stanley Electric, 7 Jul. 2011);
PTL 4: EP 2,063,170 (Audi AG, 27 May 2009);
PTL 5: U.S. Pat. No. 6,736,524 (Valeo Vision, 4 Dec. 2003);
PTL 6: U.S. Pat. No. 7,654,712 (Koito Manufacturing, 17 Jan. 2008);
PTL 7: WO 2009/131126 (Koito Manufacturing Co., Ltd, 29 Oct. 2009);
PTL 8: JP 2011-204406 (Caravell Co Ltd, 13 Oct. 2011);
PTL 9: U.S. Pat. No. 4,722,037 (Davis, 26 Jan. 1988).

SUMMARY OF INVENTION

Technical Problem

The prior art outlined above addresses the provision of a small headlight through the use of laser excitation of fluorescent materials and the ability to create both dipped and driving beam spot with some adaptive control. However, they do not allow for a high powered non-mechanical, switchable dipped to driving beam headlight with adaptive capability which can not only create the dipped and driving beam spots, but can also offer adaptive control of the range of beam spots possible and/or of the point where the cut-off is provided to obtain the dipped beam. This invention aims to address that deficiency.

Furthermore in the lamp module of U.S. Pat. No. 7,654,712 each light emission part is located adjacent to the associated fluorescent substance. In operation the light emission part and the fluorescent substance will both generate heat, and because the light emission part is located adjacent to the associated fluorescent substance it will be difficult to remove this waste heat efficiently. In the present invention, however, the semiconductor light emitting device(s) are spatially separated from the photoluminescent material, so that the waste heat generated by the semiconductor light emitting device can be dealt with separately from the waste heat generated by the photoluminescent material.

Solution to Problem

A laser based light unit may be provided for which utilises illumination of a wavelength converting medium, such as a phosphor, to convert light from the first waveband of the laser emitter to longer wavelengths of a second or more wavebands and by such a means provide a white light source. The background art discloses the use of multiple laser emitters to illuminate a phosphor to emit light which is projected by a reflecting surface, or a combination of LEDs and phosphor illuminated by a laser to create a far-field beam spot which is shaped according to the requirements of automotive lighting regulations, a system with adaptive beam shape control via the control of the laser light by mechanical means, or an array of individually controlled laser and phosphor elements. However, the prior art does not allow for a light source and optical system in which an adaptive beam spot may be created by a multitude of laser beams which illuminate a singular phosphor element and provide the adaptive beam spot control non-mechanically.

Removal of mechanical parts from the headlight offers advantage in both cost of manufacture and reliability of the headlight unit over its lifetime. Furthermore, the current invention can provide for a projector-type headlight which can create a dipped beam profile without the use of a shield to remove light from the projected beam, thereby increasing optical efficiency of the headlight.

In contrast to U.S. Pat. No. 7,654,712, in the present invention the semiconductor light emitting device(s) are spatially separated from the photoluminescent material, so that the waste heat generated by the semiconductor light emitting device can be dealt with separately from the waste heat generated by the photoluminescent material.

The invention may relate to the utilisation of an array of lasers which illuminate a phosphor light source. The array of laser emitters create an illumination on the phosphor such that variation of the output power of one or more the laser emitters causes a variation in the illumination distribution of the light source. As the output from the light source is dependent on the intensity of the illumination, the output from the light source as a function of position may be modulated non-mechanically. By providing an optical system which images the light source into the far-field, it is possible to generate a beam spot which is adaptive via non-mechanical means. Furthermore, by providing a far-field beam spot which is an image of the light source it is possible to create a beam spot which contains a cut-off that does not require the application of a light blocking shield. Such a shield removes light from the projected beam spot, reducing the efficiency of the optical system. The present invention can remove the need to provide a shield in the optical system, enhancing efficiency. As the phosphor light source is not required to be provided with either large electrical contacts, or a large heat sink, it is possible to realise configurations of an optical system that are not otherwise possible with prior art, especially prior art utilising LEDs, whereby the aforementioned contacts and heat sink would create a shadow within the far-field beam spot.

The illumination of the light source from the laser emitters may have the form of many different shapes.

The illumination of the light source may be such that the shape of an abrupt change from high to low intensity of illumination may provide a far-field beam spot which is capable of meeting the requirements as outlined in automotive lighting regulations regarding the provision of front lighting.

The illumination of the light source may have a curved edge representing change from high to low intensity of illumination.

The elbow of the illumination pattern on the light source may be located at a focal point of the optical system.

The shoulder of the illumination pattern on the light source may be located at a focal point of the optical system.

The light source may be staggered along the optical axis such that one section is set back from a focal point of the optical system, providing an improvement in spatial tolerance of illumination of the light source.

The light source may be staggered along the optical axis such that one section is set forward from a focal point of the optical system.

The light source may be provided with a dividing wall, such that the spatial tolerance of the illumination of the said light source is improved.

The dividing wall may be coated along the top with a fluorescent material to aid in the obscuring of any possible dark region which may otherwise be caused.

The illumination of the light source may be provided by multiple laser emitters each with its own lens for delivering the laser light to the light source.

The illumination of the light source may be provided by multiple laser emitters each with its own optical fibre for delivering the laser light to the light source.

The illumination of the light source may be provided by multiple laser emitters each with its own optical fibre and the output emission from the latter controlled by multiple individual lenses.

The multiple optical fibres may be arranged into an array, the output of which may be controlled by a single large lens to illuminate the light source.

The multiple laser emitters may be arranged inside of one single enclosure.

The light from a single laser emitter may be divided into multiple beams for illumination of the light source.

The array of laser emitters may be formed from static and moveable components for added control of the illumination of the light source.

The optical system may be in the form of a projector unit based upon an elliptical reflector and lens for improved efficiency.

The optical system may be based upon a hyperbolic reflector and lens projector system.

The optical system may be based upon a parabolic reflector.

The optical system may be based upon a truncated reflector for reduced volume.

The light source may be shaped to best suit the far-field beam spot profile.

A wavelength selective filter may be provided in the system for improve eye safety by acting as a passive safety element.

Information may be displayed in the projection of the light source illumination distribution.

Advantageous Effects of Invention

A first aspect of the invention provides a light source system operable in at least first and second modes to provide at least and first and second different far field illumination patterns, the system comprising: a photoluminescent material; and a light beam generator for generating at least two independently controllable sets of light beams for illuminating respective regions of the photoluminescent material; wherein the light beam generator comprises at least one semiconductor light emitting device spatially separated from the photoluminescent material. By causing the generating means to generate one set of light beams so as to illuminate one region of the photoluminescent material, the one region of the photoluminescent material is caused to emit visible light and thus generate one far field illumination pattern, whereas causing the generating means to generate another set of light beams so as to illuminate another region of the photoluminescent material, the another region of the photoluminescent material is caused to emit visible light and thus generate another far field illumination pattern. By specifying that the sets of light beams are independently controllable is meant that the intensity of light beams of one set is controllable independently of the intensity of light beams of the other set. (It should be noted that the region of the photoluminescent material that is illuminated by one set of light beams may or may not overlap the region of the photoluminescent material that is illuminated by another set of light beams.)

The photoluminescent material may be a fluorescent material, such as a fluorescent phosphor.

For the avoidance of doubt, the term "phosphor" as used herein includes a nanophosphor.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF DRAWINGS

In the annexed drawings, like references indicate like parts or features:

FIG. 8b: beam spot created from light source configuration in FIG. 8a.

FIG. 12b: plan view of the light source as described in FIG. 12a.

DESCRIPTION OF EMBODIMENTS

Figure 1:
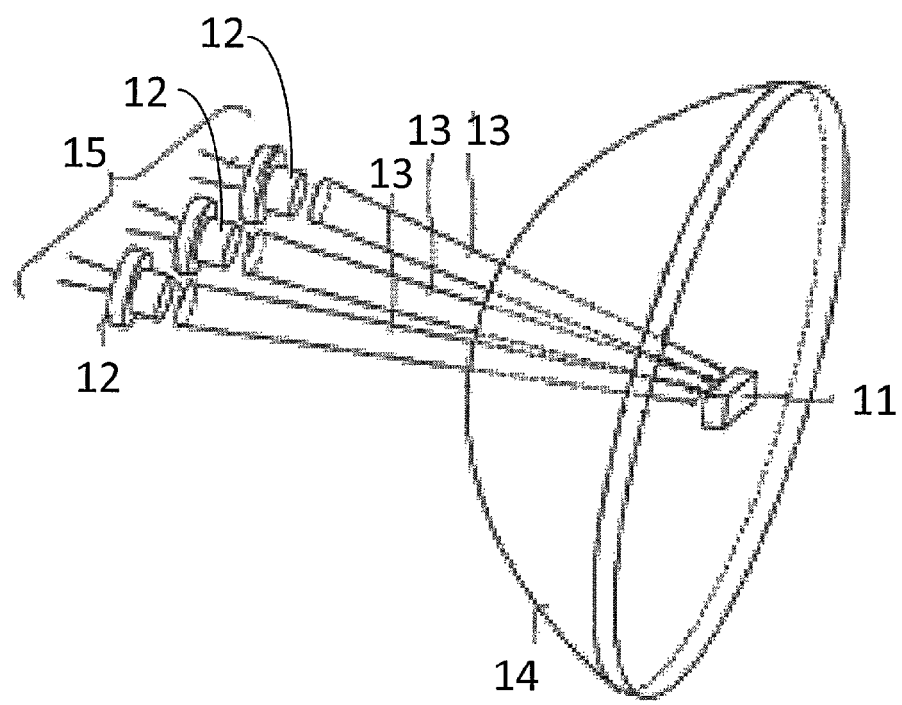
FIG. 1: example of a laser based headlight unit with array-like illumination, constituting a conventional art.
Figure 2:
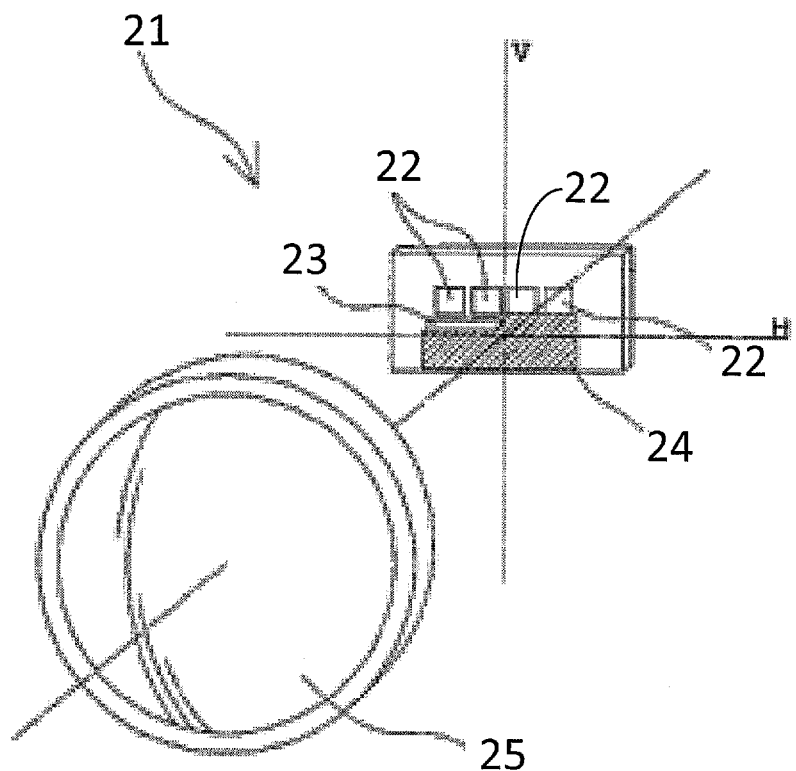
FIG. 2: example of a laser emitter and LED based headlight unit, constituting a conventional art.
Figure 3:
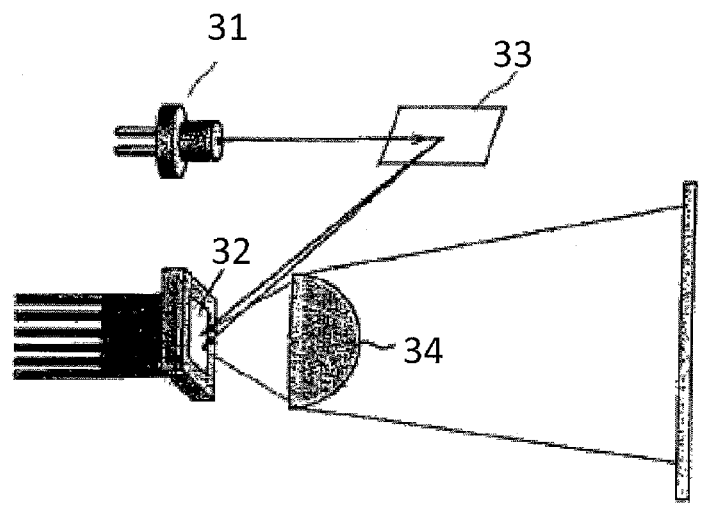
FIG. 3: laser based light source including a mechanical moving element, constituting a conventional art.
Figure 4:
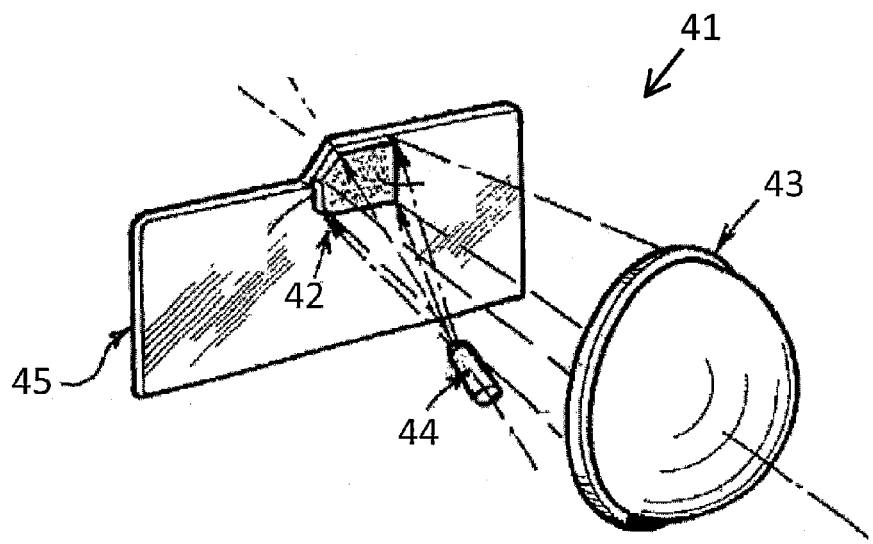
FIG. 4: laser based headlight unit including shaped emission part, constituting a conventional art.
Figure 5:
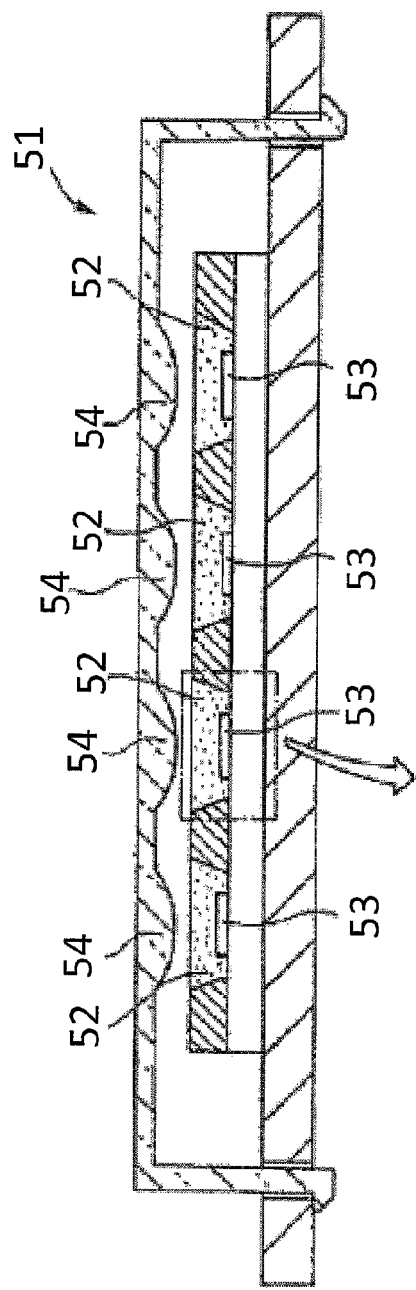
FIG. 5: laser based headlight unit including multiple emitters and phosphor in an array, constituting a conventional art.
Figure 6A:
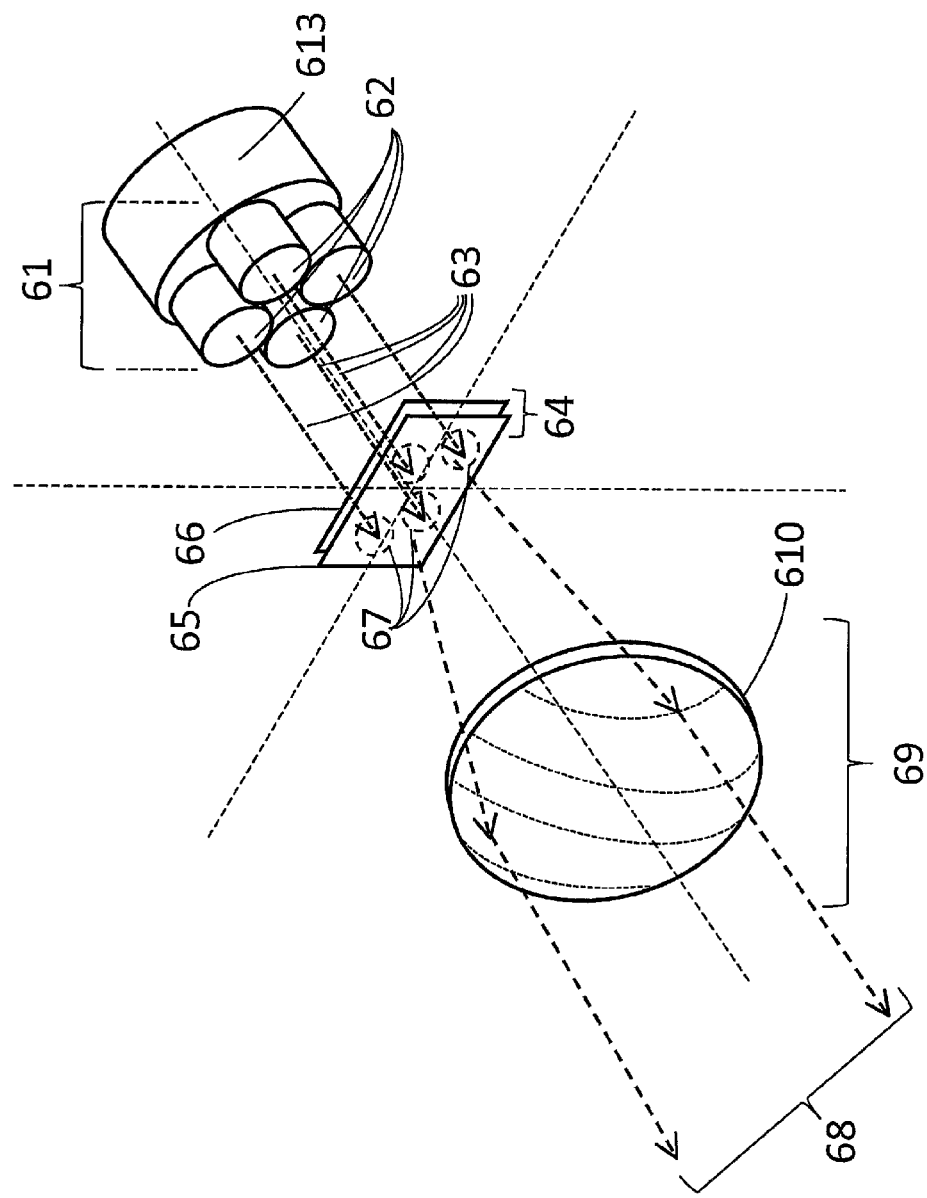
FIG. 6a: overview of the main embodiment of the present invention.

The main embodiment of the present invention is described herein and an overview of the same is presented in FIG. 6a. A group of laser light sources 61 is comprised of an array of multiple individual laser emitters 62. The laser emitters 62 may be mounted on a heat sink 613 if necessary. From herein the heat sink 613 will be omitted from figures for clarity, but may always be associated with laser emitters 62 or a laser emitter array 61. The laser emitters 62 emit, in use, light beams 63 of a first waveband. The light beams 63 of the first waveband from the laser emitters 62 are directed onto a light source 64 comprising a fluorescent material 65 which it deposited onto a substrate 66. From herein the light source 64 will generally be shown as one object. The individual light beams 63 form an array of illumination spots 67 on the light source 64 which are distinct, but not necessarily separated from one another. The fluorescent material 65 converts the light of the first waveband into light of a second or more wavebands with longer wavelength. The secondary light 68 of the second waveband is subsequently emitted from the light source 64 is collected by an optical system 69 which images the light source 64 into the far field. The optical system 69 is shown as a primary lens 610 in this embodiment for illustrative purposes, but should not be limited to one such type of image forming apparatus.

For the purposes of description of the present invention, when describing the light source 64, it is understood that the term "illumination spot" is directly equivalent to "emission spot" as the light source 64 only emits light of the second or more wavebands from a position illuminated by light of the first waveband from the laser emitters 62 and that emission of light from the light source 64 is otherwise not possible. Therefore, discussion of illumination from the laser emitters 62 implicitly indicates emission from the light source 64.

The laser emitters 62 may be replaced with other semiconductor light emitters, for example light emitting diodes (LED) which are applied with a suitable collimating optic to direct the light from the LED onto the fluorescent material 65 of the light source 64. Use of such LEDs will result in a headlight which is significantly larger than one constructed using laser emitters.

The fluorescent material 65 may be made from phosphors and deposited on the substrate 66 in a thin layer, the manufacture of which is well known and will not be disclosed further within this invention. The constituent parts of the fluorescent material 65 may vary depending on the wavelength of the first waveband and hence the formation of the second or more wavebands of light may be via two routes. Firstly, the light of the first waveband may be non-visible, or have a wavelength such that it generates a very low response in the human eye, such wavelengths being 415 nm or shorter. In this instance, the fluorescent material 65 may be constituted of a combination of two or more of red, green, blue or yellow phosphors which are caused to emit light within the red, green, blue or yellow second wavebands respectively when illuminated by light of 415 nm or shorter. The combination of two or more of the aforementioned second wavebands, but excluding the first waveband produced by the laser emitter, may be mixed to produce light perceived as white. The second method of producing white light via the use of a first waveband in the range 430 nm to 470 nm and a combination of one or more of a red, green or yellow phosphor which is caused to emit light within the red, green or yellow second wavebands respectively when illuminated by light within the range of 430 nm to 470 nm. The combination of the part of light of the first waveband that is not absorbed by the fluorescent material and one or more of the second wavebands produces light with a colour perceived as white.

Figure 6B:
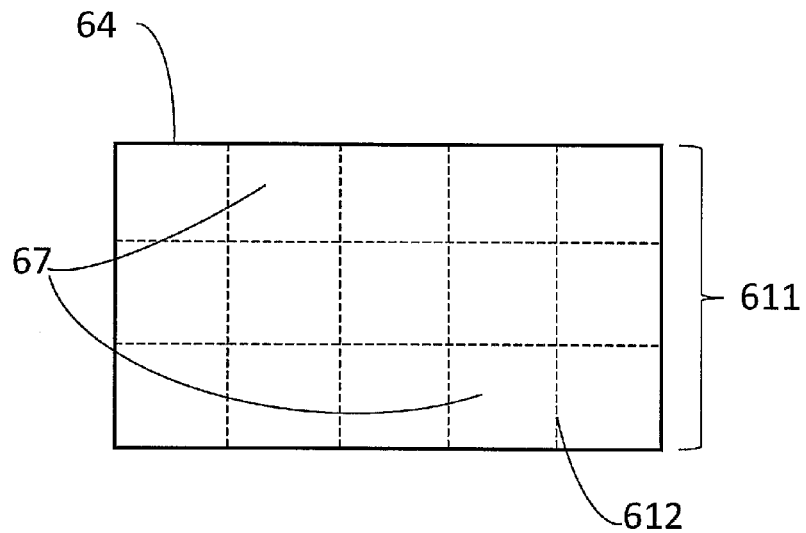
FIG. 6b: plan view of the light source of the main embodiment of the present invention.

FIG. 6*b* shows a plan view of the light source 64 in which the illumination spots 67 form an array 611 which illuminates the whole of the light source 64, the dashed lines representing boundaries 612 between the different illumination spots 67. Each laser emitter illuminates an individual illumination spot 67. It is not necessary for the illumination spots 67 to be contained completely within the array boundaries and some overlap of the adjacent cells of the array 611 is allowed, but this is not shown for clarity of the illustration. The relative intensity of each section of the array 611 on the light source 64 may be controlled by altering the output power of each of the laser emitters 62, thereby controlling the intensity of emission from the light source 64 as a function of spatial position. The spatial brightness variation of the light source 64 is imaged into the far-field by the optical system creating a freely adaptive beam spot.

The individual illumination spots 67 within the array 611 may be each formed from the light from individual single laser emitters. Alternatively, it is also possible for the individual illumination spots 67 to be formed from the light from more than one laser emitter. In the case of the latter, the light from the multiple laser emitters is expected to overlap completely to provide a single illumination spot 67, such that the variation of output from the laser emitters incorporated into one illumination spot 67 will only result in a change in brightness of emission from the illuminated spot 67 and not a change in shape of the illumination spot 67. This will offer a degree of redundancy if one of the laser emitters should happen to fail or reduce in output power. The complete array 611 can then still formed from multiple illumination spots 67, each formed by illumination from multiple laser emitters.

The advantage of the current invention arises from the arrangement of the illuminations spots 67 on the light source 64 to give freedom in the creation of such a light source 64 with freely controllable spatial variation in the intensity of the emitted light without mechanical components. By this means the whole adaptive light source is electronically switchable. Further arrangements of the light source 64, laser emitters 62 and the delivery of the light thereof will be described herein.

FIGS. 7*a*-7*f* show different aspects of the illumination of the light source 64 with the laser emitters 62. In all cases the illumination spots will be indicated by a perimeter line. The intention is to show a shape indicative of the illumination spot, but not to define the absolute boundary of the illumination spot. Therefore, the perimeter line may be thought of as representing an isolux within the illumination spot. Nor does the perimeter line indicate an enclosed region of constant area brightness. For example, the distribution of illumination intensity within an illumination spot may be Gaussian, which is well known for laser beam power distributions and the perimeter line may represent the location of the half isolux of maximum intensity of the Gaussian distribution.

Figure 7A:
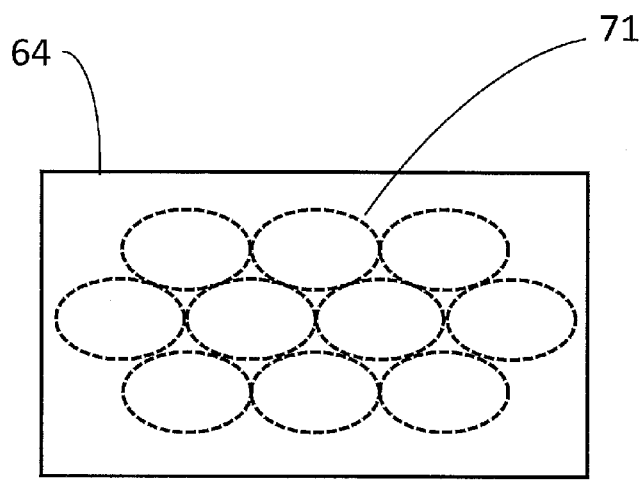
FIG. 7a: example of illumination spot configuration pertaining to the main embodiment of the present invention.

The illumination of the light source 64 may be an array of oval illumination spots 71, as shown in FIG. 7*a*. The ratio of the two axes of the oval shape may be from circular, 1:1, to significantly elongated, 10:1.

Figure 7B:
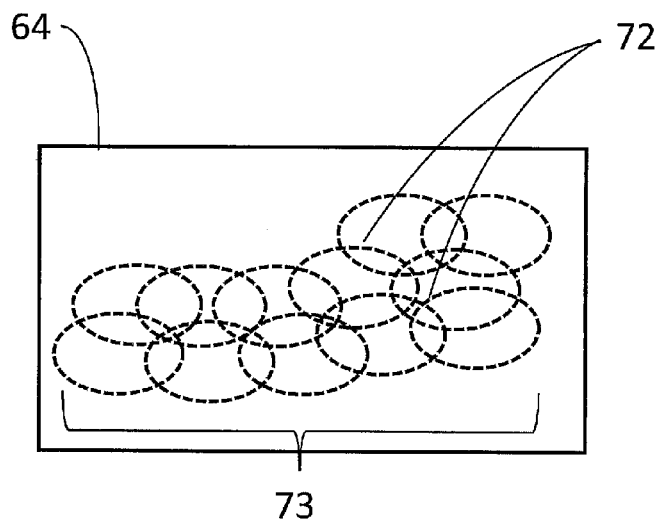
FIG. 7b: example of alternative illumination spot configuration, overlapping spots.

The illumination of the light source 64 may be from overlapping illumination spots 72, again shown as oval, as shown in FIG. 7*b*. Also shown in FIG. 7*b* is the fact that the illumination spots 72 may be within a non-regular or non-uniform array, such that a more freeform illumination distribution 73 may be formed on the light source 64.

Figure 7C:
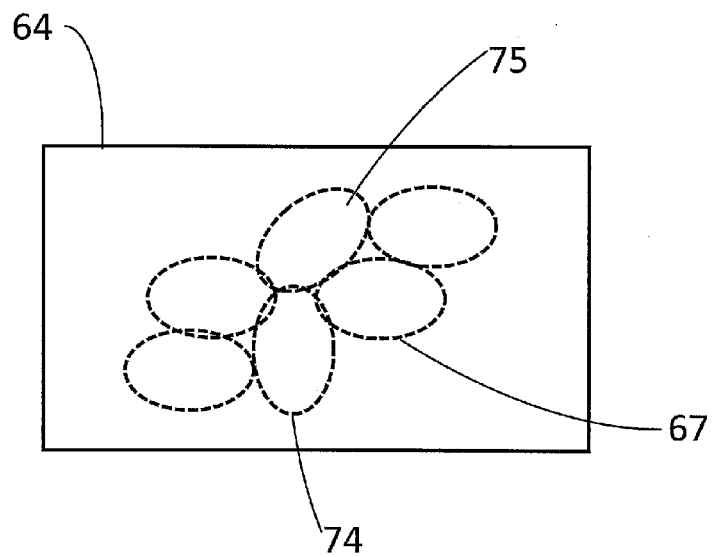
FIG. 7c: example of alternative illumination spot configuration, rotated spots.

FIG. 7*c* shows a further embodiment of the invention whereby the illumination spots 67 on the light source 64 may be orientated differently to one another. For example, a vertical illumination spot 74 is orientated such that the longer axis is vertical in the page, as opposed to horizontal. Also shown is a diagonally arranged illumination spot 75, which has an orientation other than horizontal or vertical.

Figure 7D:
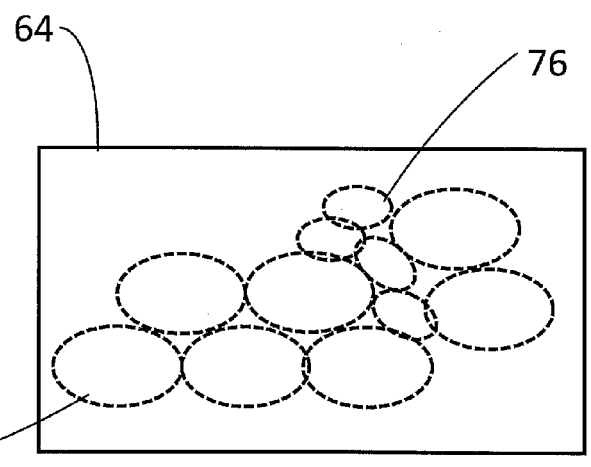
FIG. 7d: example of alternative illumination spot configuration, varying size spots.

FIG. 7*d* demonstrates that the illumination spots may be of other sizes, as well as varying orientations, shown as smaller the illumination spots 76, compared to the preceding larger illumination spots 67.

Figure 7E:
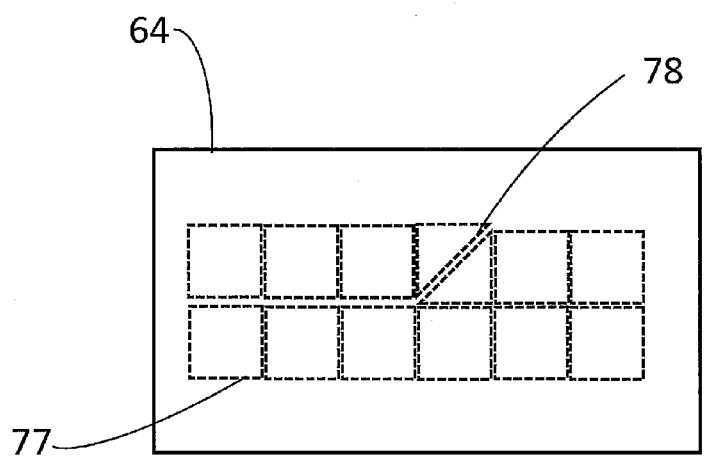
FIG. 7e: example of alternative illumination spot configuration, triangular and rectangular shapes.

FIG. 7*e* demonstrates that the illumination spots may be rectilinear 77 or triangular 78 in shape. Although illustrated as square, the rectilinear shapes 77 should not be limited to such, and may be elongated to a ratio of 10:1 on a side. The triangular shapes 78 may not be limited to right angle and can take the form of isosceles or equilateral or other irregular triangles.

Figure 7F:
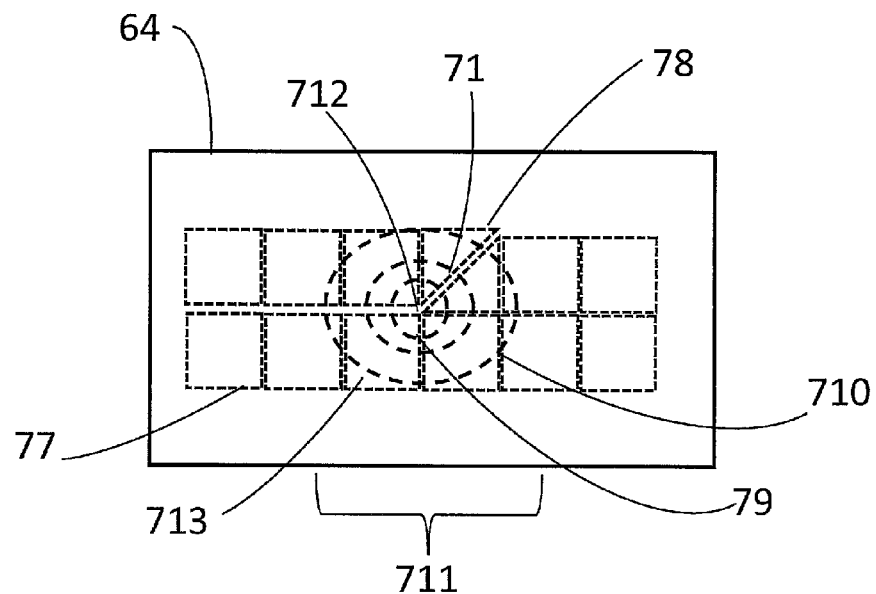
FIG. 7f: example of alternative illumination spots configuration, multiple shapes, sizes and overlapping spots.

FIG. 7*f* shows that combination of shapes may be used within one illumination distribution 79. Again the rectilinear 77 and triangular 78 shapes are shown, but superimposed are oval illumination shapes 71. Furthermore, FIG. 7*f* demonstrates that the illumination spots may be configured such that smaller illumination spots 79 lie completely within larger illumination spots 710, so that overlap is complete. By this method a composite illumination spot 711 may be achieved whereby the region near the middle 712 of the composite illumination spot is considerably more intensely illuminated than the regions nearer the edges 713.

By the above methods it is shown that the light source may illuminated by a variety of illumination spots whose position on the light source is pre-determined by the attributes of the laser emitter array creating the illumination. The brightness distribution is then determined by the output from each of the individual laser emitters, this is achieved dynamically. The shapes cited are not inclusive of all possible shapes, but variations upon them will be well known to someone skilled in the art, and as such may include racetrack, pentagonal, hexagonal and those upwards in side number, figure of eight, bow-tie and other shapes with a waist, annular and other shapes in which a central section is enclosed by an external section and finally, free-form shapes with a combination of straight or curved sides.

The second embodiment of the present invention relates to the formation of emission of light from the light source 64 to which can be imaged by an optical system 34 into the far-field to create a beam spot distribution appropriate to meet automotive regulations regarding photometric measurements. Due to the variation of regulations between different regions of the world the exact beam spot distribution will not be described, only the most pertinent components. The terminology used will be that found within the UNECE automotive regulations regarding headlight beam spot distributions, for example UNECE Addendum 111: Regulation No. 112, Revision 2 "Uniform provisions concerning the approval of motor vehicle headlamps emitting an asymmetrical passing beam or a driving beam or both and equipped with filament lamps and/or light-emitting diode (LED) modules". The most basic requirement is that of the provision of a dipped beam and driving beam from the headlight unit of an automobile. These will be described within this embodiment, first the dipped beam only and then the combined dipped and driving beam.

Figure 8A:
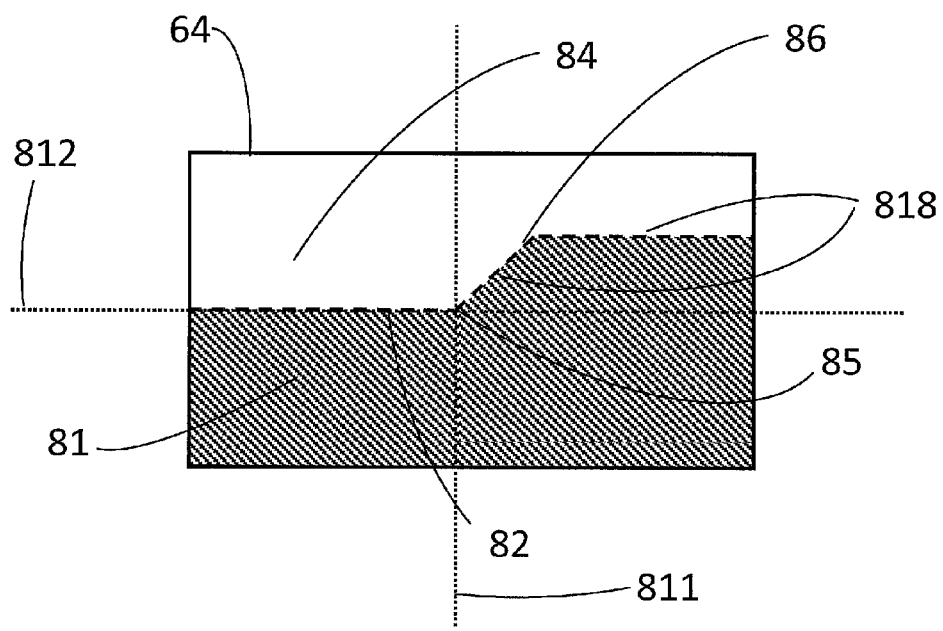
FIG. 8a: plan view of light source of further embodiment of the present invention, first illumination distribution details.

FIG. 8*a* shows a plan view of the light source 64 with a primary illumination distribution 81 from the multiple laser diode emitters. It is understood that the primary illumination distribution 81 is formed from an array of illumination spots, but neither that the array nor illumination spots are shown for clarity as the exact configuration of illumination spots made by the laser emitters may be one of a number of shapes or sizes, and may constitute any or multiple instances of the configurations disclosed in previous embodiments. The primary illumination distribution 81 is formed in the lower half of the plan view of the light source 64, such that there is a distinct and sharp change in brightness along a clearly defined cut-off line 82 from a high brightness primary illumination distribution 81 to low brightness region 84 (which possibly is not illuminated) approximately across the middle of the light source 64. The cut-off line 82 is itself not a real entity, but is in effect an indication on the light source 64 as to the position of a rapid change in illumination brightness as a function of position. The cut-off line 82 as shown is similar to a form which, when imaged through an optical system, will produce a beam spot distribution on the road which meets the automotive regulation (e.g. UNECE or FMVSS) requirements for a dipped beam, in as much that it contains a cut-off. The cut-off line 82 itself is formed from straight sections of line 818 (one section also denoted by 82) which meet at corners at locations known as the elbow 85 and the shoulder 86. The shaded region of the primary illumination distribution 81 is only to denote a region that is illuminated, it does not denote a region of constant brightness illumination, and indeed the invention is not limited to constant illumination brightness within this region. The orientation of the light source 64 in FIG. 8*a* is also not indicative of the orientation of the same in a headlight unit. It may be rotated about both the vertical axis 811 and the horizontal axis 812 depending on the optical system used and/or the political region in which the headlight is employed, i.e. left or right hand drive.

Figure 8B:
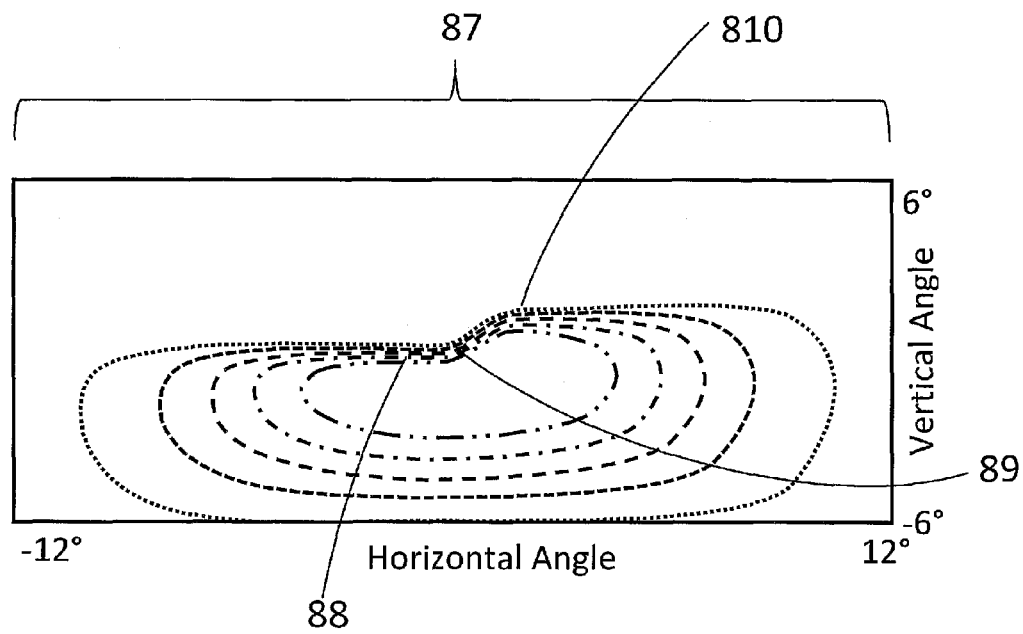

FIG. 8*b* shows an example far-field brightness distribution 87 produced by such a primary illumination pattern 81 on the light source 64. The far-field cut-off 88, the far-field elbow 89 and the far-field shoulder 810 can clearly be distinguished. FIG. 8*b* shows example contours of constant brightness of the far-field brightness distribution. Of the contours shown in FIG. 8*b*, the innermost contour (denoted by the "dash-dot-dot" line) has the highest brightness of the contours shown, and the brightness represented by each contour decreases going from the innermost contour towards the outermost contour. The outermost contour (denoted by the dotted line) has the lowest brightness of the contours shown in FIG. 8*b*.

The light source 64 as described above is split into a high brightness primary illumination distribution 81 and a low brightness region 84. This is by way of example and it is not always the case that these two regions will always be solely high or low brightness. If required it is possible to increase the illumination of the low brightness region 84, to increase its light emission, or to decrease the illumination of the high brightness region 81, to decrease its emission. Indeed it may be possible for the two regions as described above to switch ranking in their relative emission strength, so that the region 84 has a higher brightness than region 81. It may also be possible for the region 84 to have approximately the same brightness as region 81. Furthermore, it is not expected that the high brightness region 81 or the low brightness region 84 are uniformly illuminated within their illustrated boundaries. To that end full adaptive control of the emitted far-field beam spot, an example of which is illustrated in FIG. 8*b*, may be realised. One such variation of the illumination of the light source 64 is described in the following text, by way of further example.

Figure 8C:
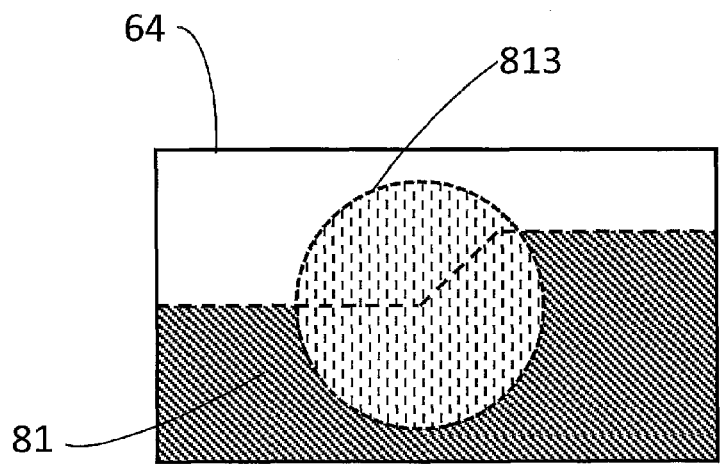
FIG. 8c: plan view of light source, second illumination distribution details.

FIG. 8*c* demonstrates an alternative configuration of the light source to meet the most basic requirements of the automotive regulations. The light source 64 is shown with two illuminated regions, the primary illumination distribution 81, as before, and a secondary illumination distribution 813. The former is exactly as described above and is not discussed further. The secondary illumination distribution 813 is arranged such that it provides the driving beam element of the projected headlight distribution. As before, the illumination distribution within the secondary illumination distribution 813 is not required to be perfectly uniform in intensity. The arrangement of both the primary 81 and secondary 813 illumination distributions is formed from any combination of the illumination spots that have been described above within this disclosure. In the example of FIG. 8*c*, the primary 81 illumination distribution and the secondary 813 illumination distribution overlap one another. In the overlap region, the intensity will be equal to the sum of the intensity of the primary 81 illumination distribution and the intensity of the secondary 813 illumination distribution. The configuration of FIG. 8*c* may be generated using one set of light beams to generate the secondary 813 illumination distribution and one set of light beams to generate the primary 81 illumination distribution (so that any region where the primary 81 illumination distribution and the secondary 813 illumination distribution overlap one another is illuminated by light beams from both sets). Alternatively, the configuration of FIG. 8*c* may be generated using one set of light beams to generate that part of the secondary 813 illumination distribution outside the primary 81 illumination distribution and one set of light beams to generate the primary 81 illumination distribution, with the intensity of the light beams being greater in the overlap region.

Figure 8D:
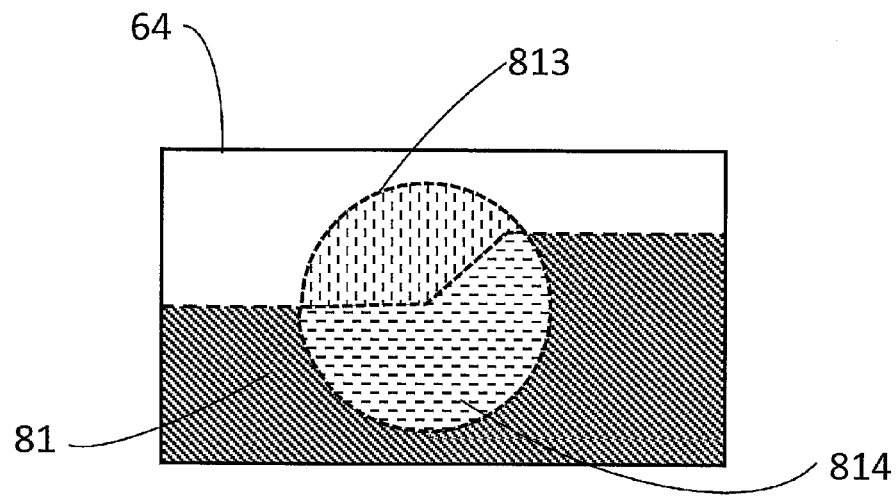
FIG. 8d: plan view of light source, detail of overlap of illumination distributions.
Figure 8E:
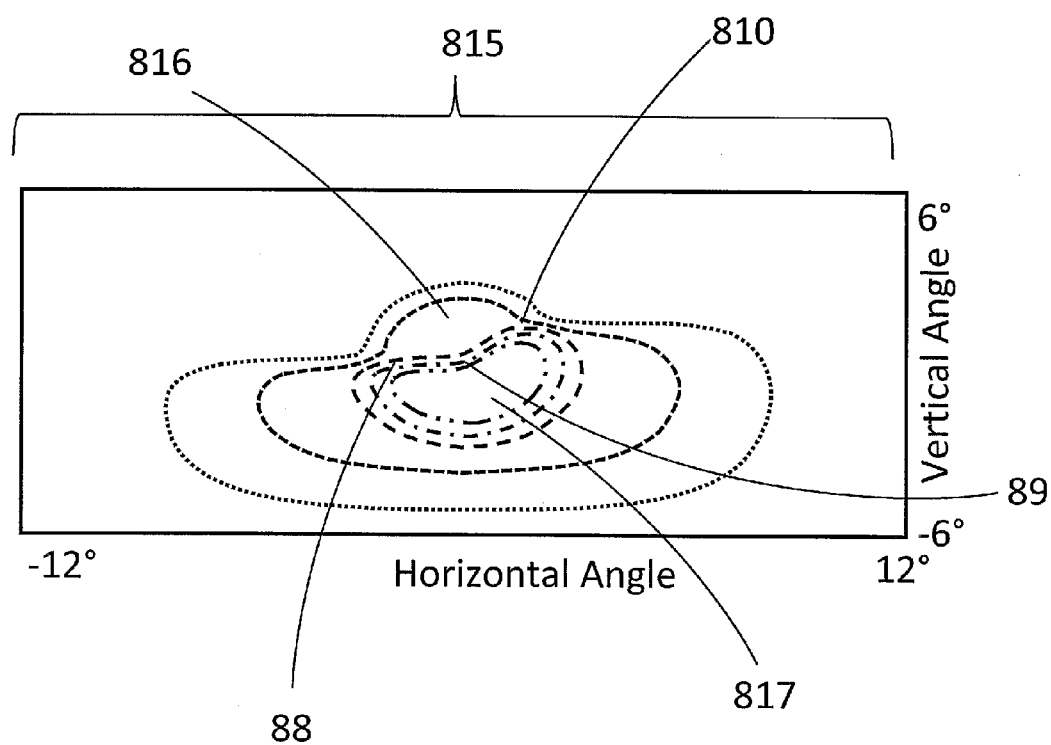
FIG. 8e: beam spot created form light source configuration in FIGS. 8c and 8d.

As noted an overlap region 814 may exist between the primary 81 and secondary 813 illumination distributions and an example of this is shown in FIG. 8*d*. This overlap region 814 will have a brightness distribution formed by the variation of the intensity of the illumination within the spots that may form it. To that end it may be formed by an increase in brightness of the laser emitters that created the portion of the primary illumination distribution 81 within the overlap region 814, or it may be formed by a distinct and separate number of laser emitters, from those forming the primary illumination distribution 81, arranged to form an illumination spot the shape of the secondary illumination distribution 813. An example of the latter configuration has been previously demonstrated in FIG. 7*f*. For the purposes of demonstration, FIG. 8*e* shows the beam spot produced when the emission from the light source 64 is such that the primary illumination distribution 81 and the secondary illumination distribution 813 have the same particular uniform intensity distribution of emission per unit area which results in the overlap region 814, FIG. 8*d*, having an intensity distribution of emission per unit area being the sum of that in the primary 81 and secondary 813 illumination distributions. Therefore, the output intensity as a function of unit area, from the overlap region 814 is twice that of the other two illumination distributions 81, 813. The current invention should not be limited to such a simple addition of the intensity of the overlap region 814. Indeed, the overlap region 814 may be considered as having its own separately definable intensity distribution of illumination, if so required. FIG. 8*e* shows the new combined beam spot 815 formed from the primary 81 and secondary illumination distributions 813. It illustrates a far-field beam spot brightness distribution 815 which is indicative of a combined dipped and driving beam provided for by the automotive regulations regarding automotive lighting systems, but not intended to indicate a beam spot which is fully compliant with the requirements of those same automotive regulations. The far-field cut-off 88, far-field elbow 89, far-field shoulder 810 are still visible. Also visible is a new region of the beam spot 816 which is formed from the part of the primary illumination distribution 81 which is not overlapped with the secondary illumination distribution 813 and a brighter region of the beam spot 817 which is formed from the overlap region 814 upon the light source of the primary 81 and secondary 813 illumination distributions. FIG. 8*e* also shows example contours of constant brightness of the far-field brightness distribution. As is the case in FIG. 8*b*, the innermost contour shown in FIG. 8*e* (denoted by the "dash-dot-dot" line) has the highest brightness of the contours shown, and the brightness represented by each contour decreases going from the innermost contour towards the outermost contour. The outermost contour (denoted by the dotted line) has the lowest brightness of the contours shown in FIG. 8*e*.

It should be understood that FIGS. 8*a* and 8*c* show only two examples of possible modes of the light source, and that other examples are possible. For example, there may be no overlap between the primary illumination distribution 81 and the secondary illumination distribution 813. As a further example, the secondary illumination distribution 813 may be wholly within the primary illumination distribution 81.

By the control of the intensity of illumination of the light source from the laser emitters it is therefore possible to switch from dipped beam to driving beam electronically without the need to mechanical, moving parts, offering advantage in simplicity, reliability and longevity of a headlight unit. Furthermore, control of the illumination intensity across the whole source can lead to an adaptive beam spot, beyond the simple confines of the dipped or driving beam brightness distribution.

Figure 9:
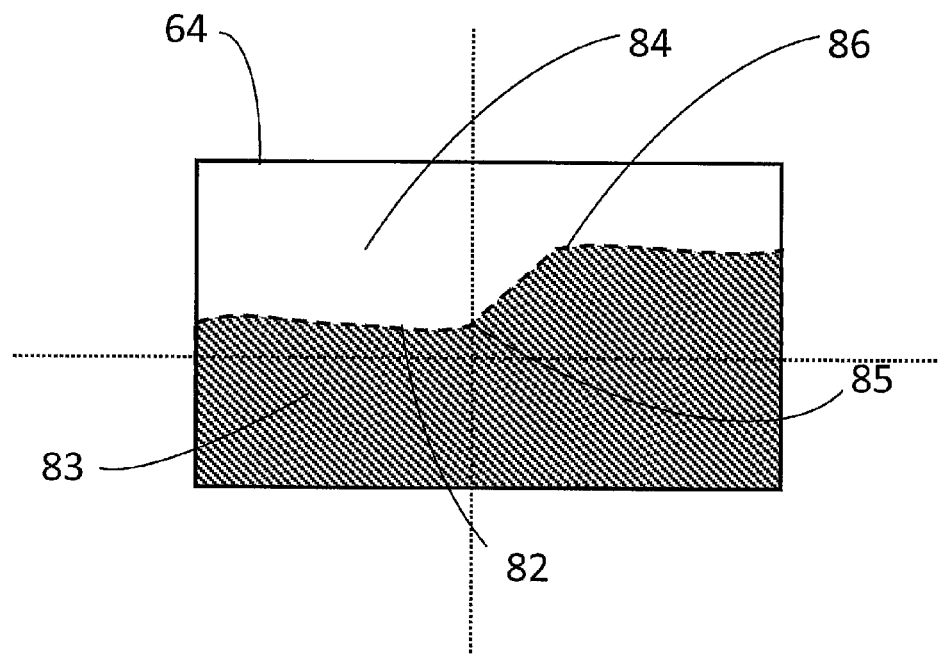
FIG. 9: further embodiment of present invention. Plan view of light source and alternative illumination distribution shape.

FIG. 9 shows another embodiment of the present invention by which the cut-off line 82 formed between the high brightness region 83 and the low brightness region 84 may be formed from curves as opposed to straight sections of line. The particular shape of the cut-off line 82 shown in the figure is for demonstration only and it is expected that other curves may be realised within the invention. However, the location of elbow 85 and shoulder 86 are indicated for illustrative purposes.

Figure 10A:
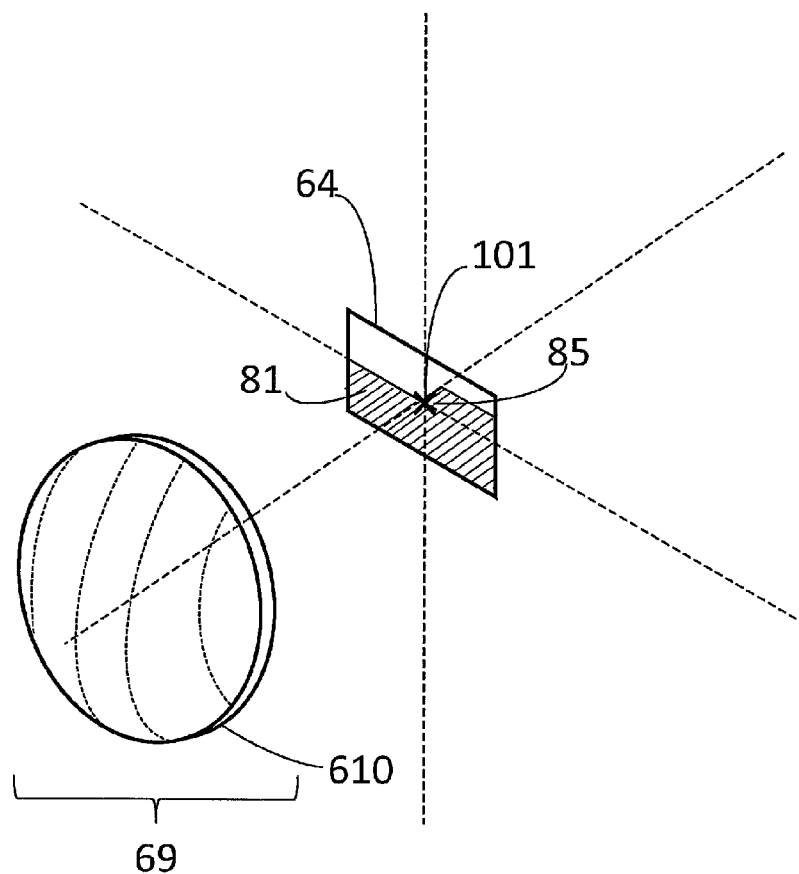
FIG. 10a: further embodiment of the present invention, particular location of the light source in the system.
Figure 10B:
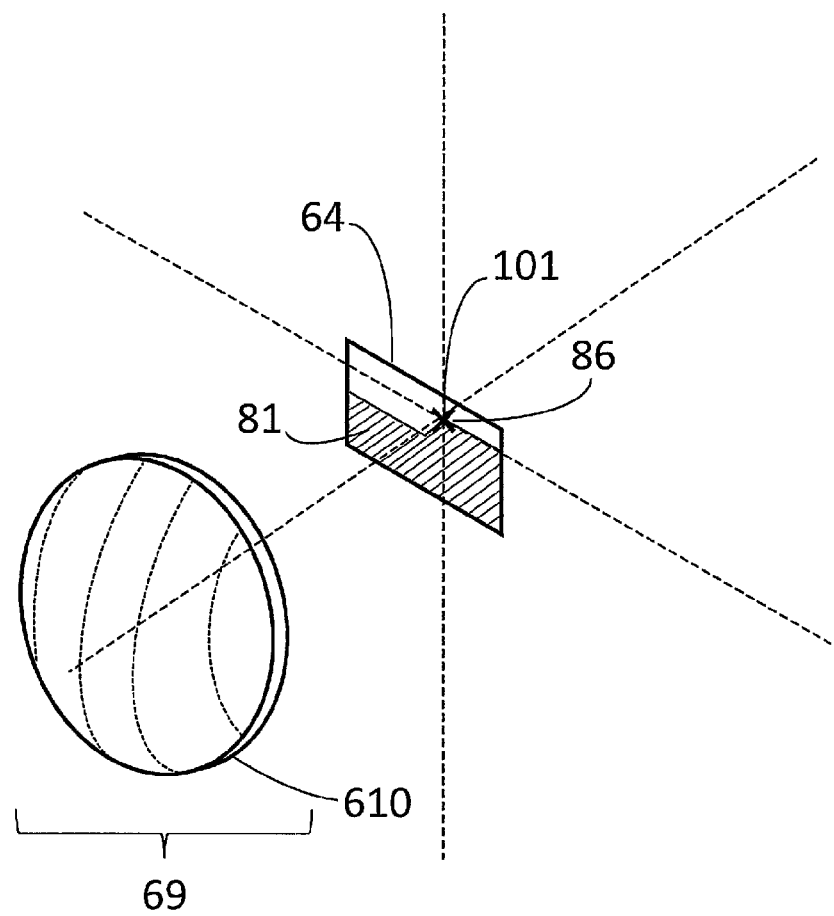
FIG. 10b: alternative particular location of the light source in the system.

FIG. 10*a* demonstrates a further embodiment of the invention, whereby the elbow 85 of the primary illumination region 81 within the light source 64 is located at the focal point 101 of the optical system 69. Alternatively, as shown in FIG. 10*b*, the shoulder 86 of the primary illumination region 81 within the light source 64 is located at the focal point 101 of the optical system 69. By this arrangement the most critical part of the beam can be projected into the far field most accurately, in this instance, the elbow 85, or the shoulder 86. The location of the light source 64 relative to the focal point 101 of the optical system 69 may not be restricted to just these two positions. It may be located at the centre of a secondary illumination region, or at any location in which region of the light source to be most accurately imaged into the far-field is placed.

Figure 11A:
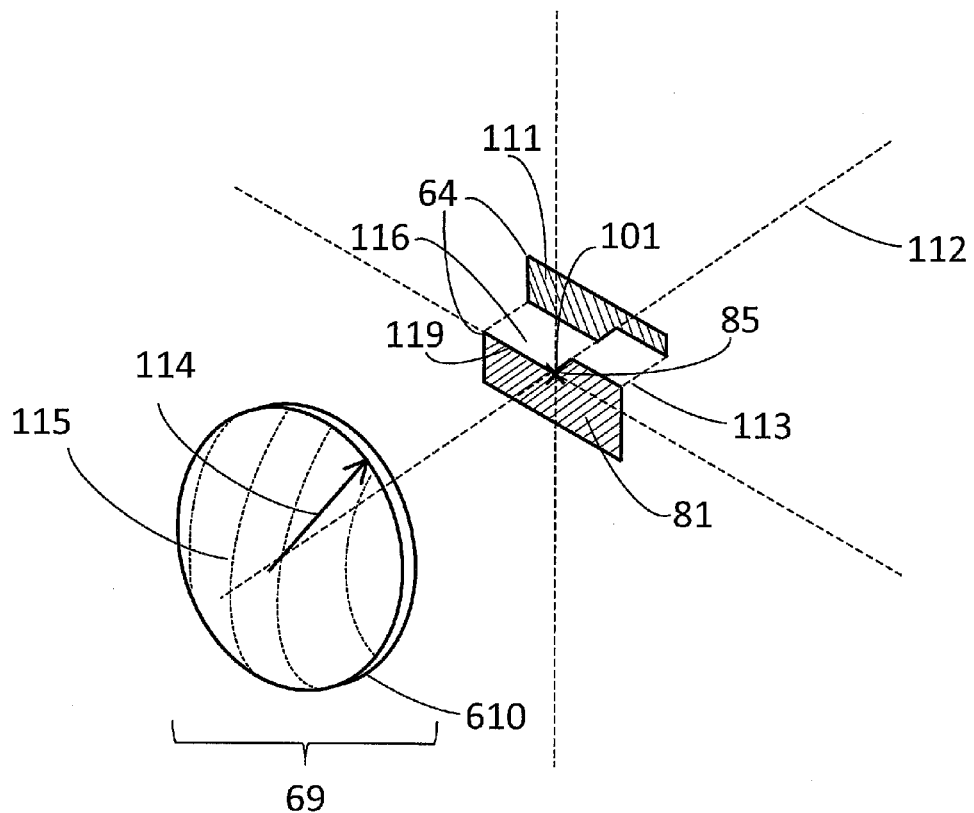
FIG. 11a: further embodiment of the present invention. Split light source within system with a portion of the light source set back from the focal point.
Figure 11B:
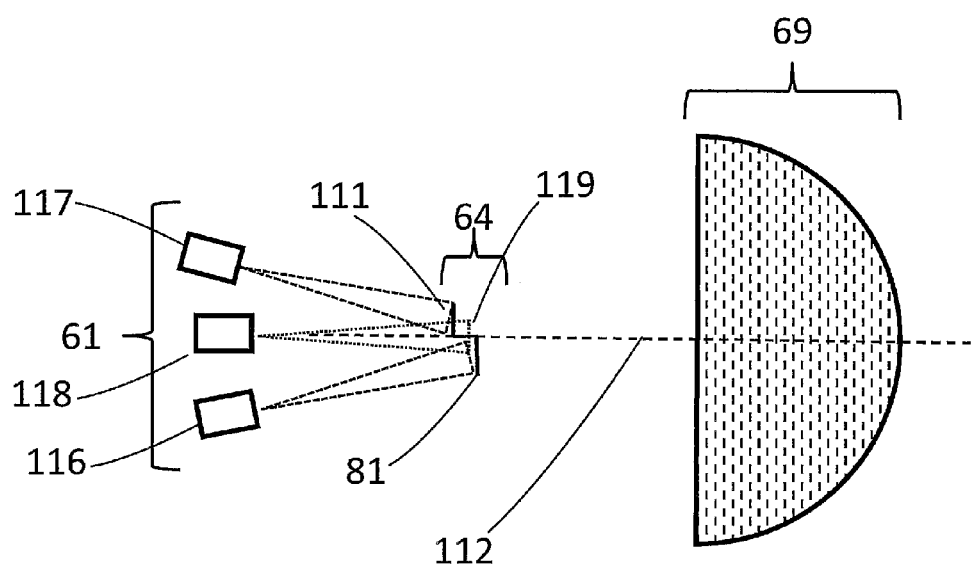
FIG. 11b: side view illustrating laser illumination configurations.

FIG. 11*a* shows a further embodiment of the present invention, whereby the light source 64 is divided into two, or more, significant sections along a division line 119. In this example, the light source 64 is divided into the previous identified primary illumination region 81 and a remainder 111 by a division line 119 which is the same profile as the previously identified cut-off line, identified as 82 in FIG. 8*a* for example. The elbow 85 of the primary illumination region 81 is arranged such that it is at the focal point 101 of the optical system 69. The remainder 111 is moved in a direction parallel to the optical axis 112 of the system such that the remainder 111 is set back from the focal point 101 (that is, is nearer the group of light sources 61) relative to the primary illumination region 81. The primary illumination region 81 and the remainder 111 are each preferably perpendicular, or substantially perpendicular to the optical axis—the light source could in principle operate to provide a beam spot if the primary illumination region 81 and the remainder 111 were not perpendicular to the optical axis, but the quality of the projected beam spot would be expected to deteriorate if the primary illumination region 81 and the remainder 111 were significantly away from a position substantially perpendicular to the optical axis. The distance 113 by which the remainder 111 is moved can be varied depending on the requirements of the optical system 69, but is expected to be from 0 mm up to a dimension which is ⅓ of the radius 114 of the optical system exit aperture 115. The exit aperture 115 is defined as the opening by which light may be considered to leave the optical system 69 and propagate into the far-field. The region 116 between the sections of the light source 64 may be formed from a material which is either reflective, such as aluminium or silver, absorptive, such as a black paint, or itself coated in fluorescent material. The purpose of division of the light source 64 along the division line 119 into two sections is to enhance the severity of brightness change between the primary illumination distribution 81 and the remainder 111, if for example only the primary illumination distribution 81 is illuminated by laser light and therefore is the only region to emit light. (Although the primary illumination distribution is referenced as 81 as in FIG. 8*a*, the primary illumination distribution is not limited to the specific shape shown for the primary illumination distribution 81 in FIG. 8*a* and may take any desired shape/size.) Furthermore, by separation of the two sections by some distance 113 along the optical axis 112 of the light source 64 the positional tolerance associated with the creation of the cut-off 82 is improved over a simple planar type light source 64, as shown in previous figures, for example FIG. 10a. The particular shape of the sections of the light source 64 and the particular shape of the division line 119 between them may take the form of any of those described in other embodiments of this present invention. FIG. 11b demonstrates a possible configuration of the laser emitters within the group of laser emitters 61 which enables the illumination of the light source 64 described above. A first cluster of laser emitters 116 within the group of laser emitters 61 may only be associated with the primary illumination region 81, and a second cluster of laser emitters 117 may be associated with the remainder 111. This embodiment may also optionally include a third cluster of laser emitters 118 associated with both regions (or part thereof) of the light source 64 simultaneously, thereby straddling the division line 119. The number of clusters may not be restricted to three and may indeed constitute any number up to a number which is equal to the number of lasers within the group of laser emitters 61. As used herein, a "cluster" is a group of laser emitters that illuminate a particular area of the light source 64. The laser emitters within a cluster are controllable independently of one another. It is expected that a combination of one or more of the different laser clusters may be used in conjunction with a light source 64 within the optical system 69 and that the choice of how many and which configuration is only limited by the preferred mode of operation of the optical system 69 at time of system design. The arrangement of clusters within the group of laser emitters 61 may not be restricted to the location above or below the optical axis 112 as shown in FIG. 11b and re-arrangement into the most applicable to the design requirement is allowed, for example, but not limited to, the inversion of the position of the clusters 116 and 117 with respect to the optical axis 112. Although it is preferred that the division line 119 between the two sections of the light source 64 and any cut-off between a high brightness region and a low brightness region coincide, it is not an absolute requirement upon the system for it to function as described in previous embodiments.

The embodiment of FIG. 11b may be operated in various configurations. For example the primary illumination region 81 may be illuminated with a high intensity and the remainder 111 may be illuminated with a low (or zero) intensity, or vice versa. Alternatively the primary illumination region 81 and the remainder 111 may be illuminated with approximately the same intensity as one another. As a further example, if the third cluster of laser emitters 118 is provided the embodiment of FIG. 11b may be operated in a mode in which the first and third clusters 116, 118 have a high intensity and the second cluster 117 has a low (or zero) intensity, for example to provide a mode similar to that shown in FIG. 8c or 8d (although it should be noted that the third cluster of laser emitters is not limited to providing the region 813 or 814 of FIGS. 8c and 8d, but may illuminate a region that is partly within region 81 and partly within region 111 and that may be of any size or shape.

Figure 11C:
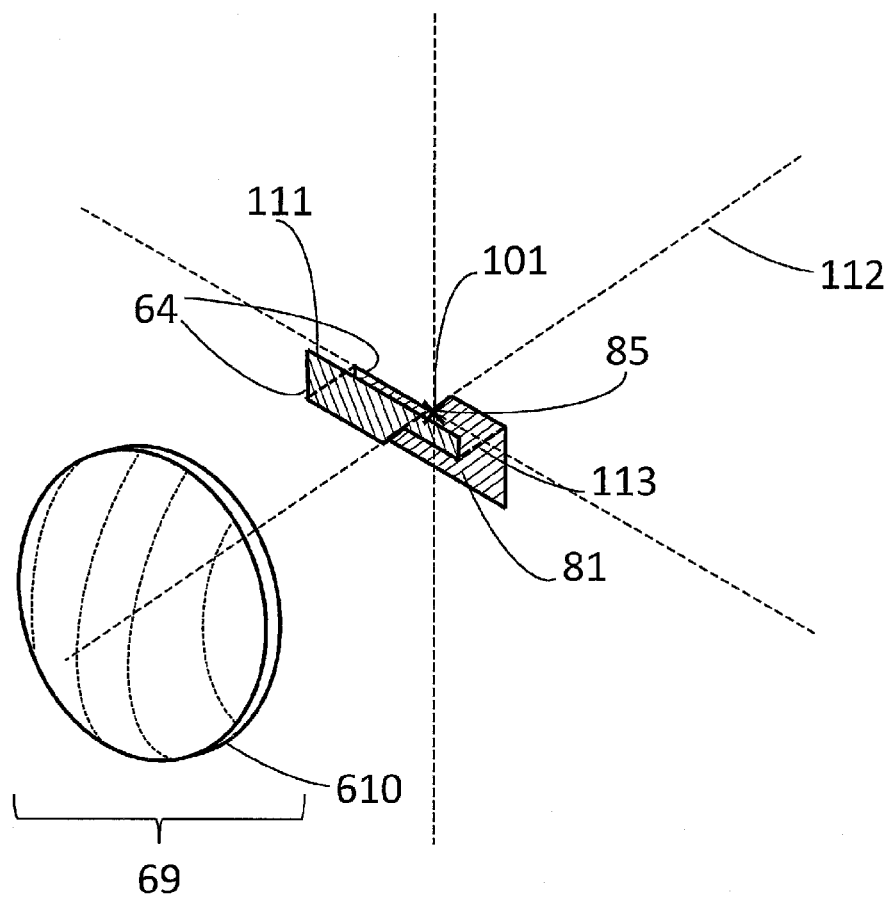
FIG. 11c: alternative light source configuration within system. Split light source with a portion of the light source set forward from the focal point.

An alternative configuration of the light source 64 is shown in FIG. 11c. In this example, the light source 64 is again divided into the previous identified primary illumination region 81 and a remainder 111 by a division line 119 which is the same profile as the previously identified cut-off line, identified as 82 in FIG. 8a for example. The primary illumination region 81 is positioned such that the elbow 85 of the primary illumination region 81 is located at the focal point 101 of the optical system 69, illustrated as a lens 610. As in FIG. 11a the remainder 111 is displaced relative to the primary illumination region 81, but in this instance the remainder 111 is moved along the optical axis 112 towards to the optical system 69, so as to be set forward from the primary illumination region 81 and focal point 101 by some distance 113. As with the embodiment of FIG. 11a, the primary illumination region 81 and the remainder 111 are each preferably perpendicular, or substantially perpendicular to the optical axis.

Figure 12A:
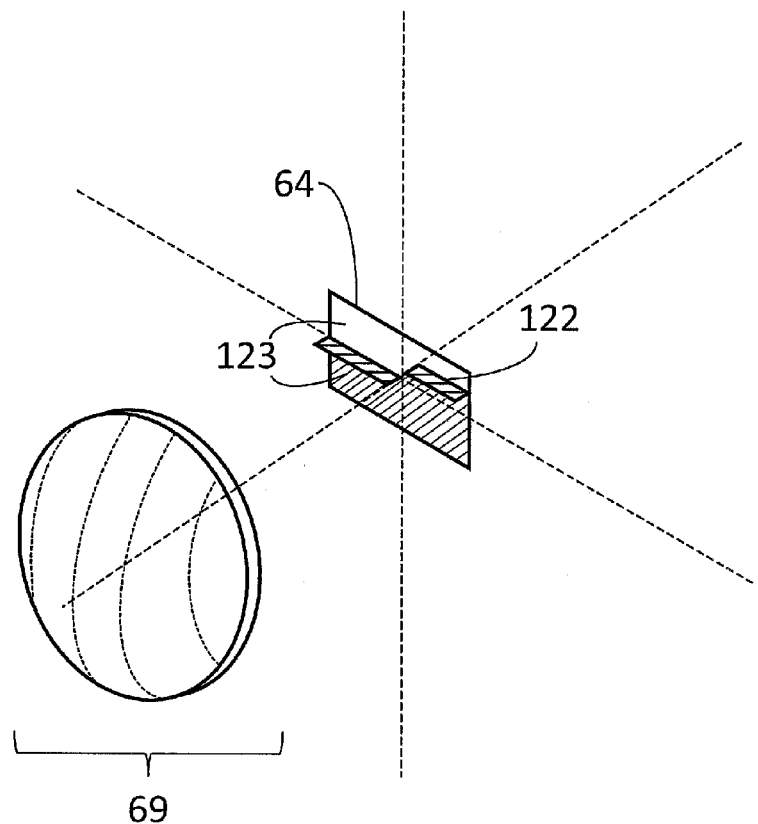
FIG. 12a: further embodiment of the present invention, dividing wall within light source, shown within system.
Figure 12B:
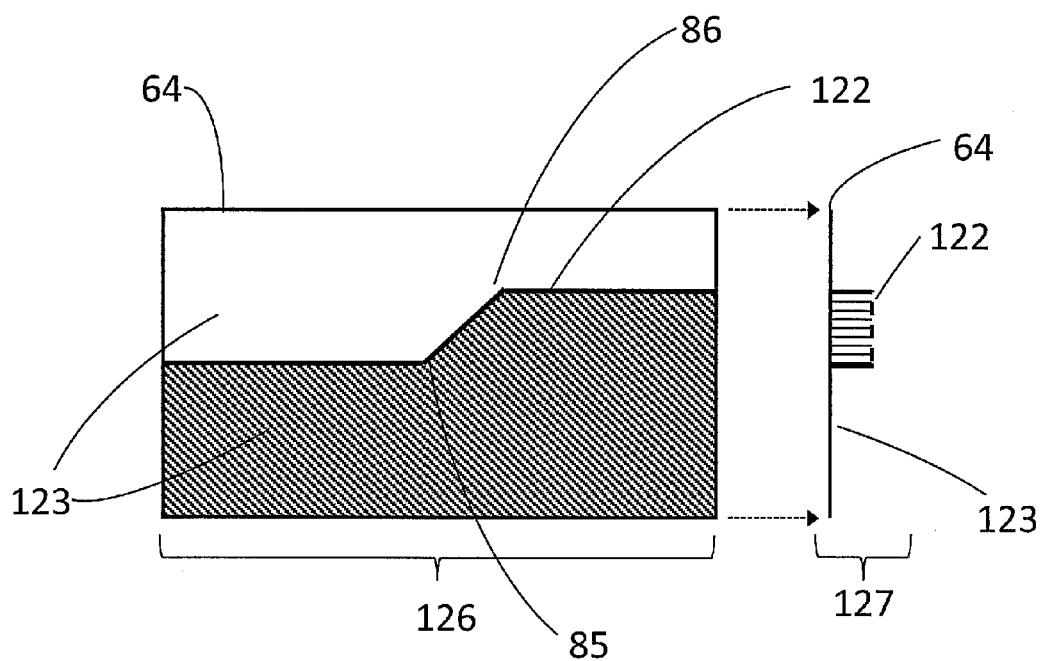
Figure 12C:
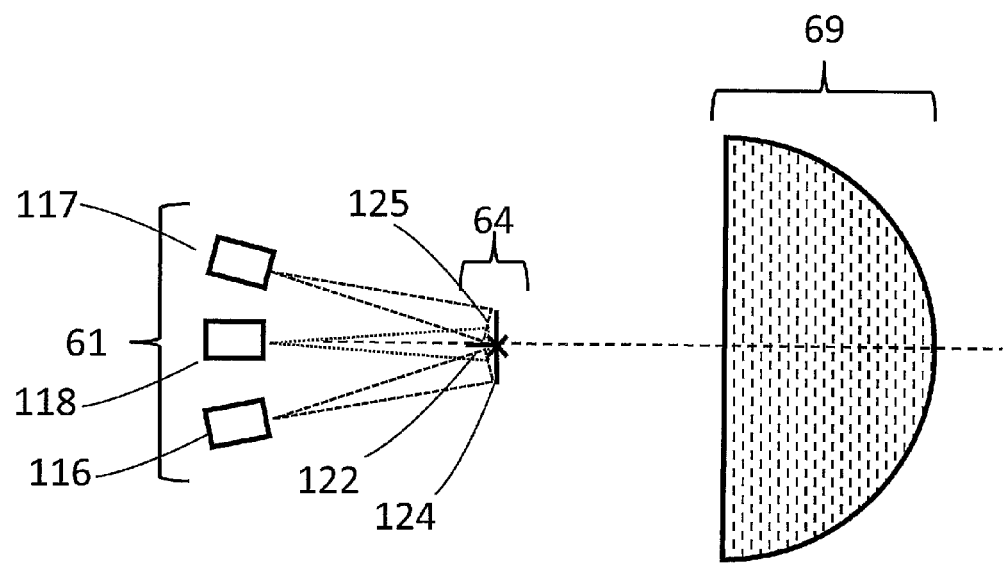
FIG. 12c: side view illustrating laser illumination configurations.

FIG. 12a demonstrates a further embodiment of the present invention. The light source 64 is once again formed from one planar piece of material, as opposed to the split configuration illustrated in FIGS. 11a, b and c. A dividing wall 122 is positioned such that it runs across the face 123 of the light source 64 and is shaped so that it creates the cut-off as described in any of the preceding embodiments; an example to highlight this formation is shown in FIG. 12b. In this figure the light source 64 is shown in plan view 126 and the dividing wall 122 is shown with elbow 85 and shoulder 86 shapes. Also shown is the light source 64 in a side view 127 to highlight that the dividing wall 122 projects out from the face 123. The purpose of the dividing wall 122 is to enhance the spatial tolerance of the location of the cut-off between high brightness and low brightness regions within the light source. The dividing wall 122 itself may be formed from a material which is reflecting or absorbing to light of both the first or second waveband, or selective reflecting or absorbing to either of the first and second wavebands. FIG. 12c demonstrates possible configurations of the laser emitters group 61 into clusters to illuminate the light source 64. A first cluster of laser emitters 116 is arranged to illuminate the area of light source 64 underneath 124 the dividing wall 122, a second cluster of laser emitters 117 is arranged to only illuminate the area of the light source 64 above 125 the dividing wall 122 and a third cluster of laser emitters 118 is arranged to illuminate both areas (or part thereof) of the light source 64 simultaneously, thereby straddling the dividing wall 122. Also shown for reference is the optical system 69.

Figure 13:
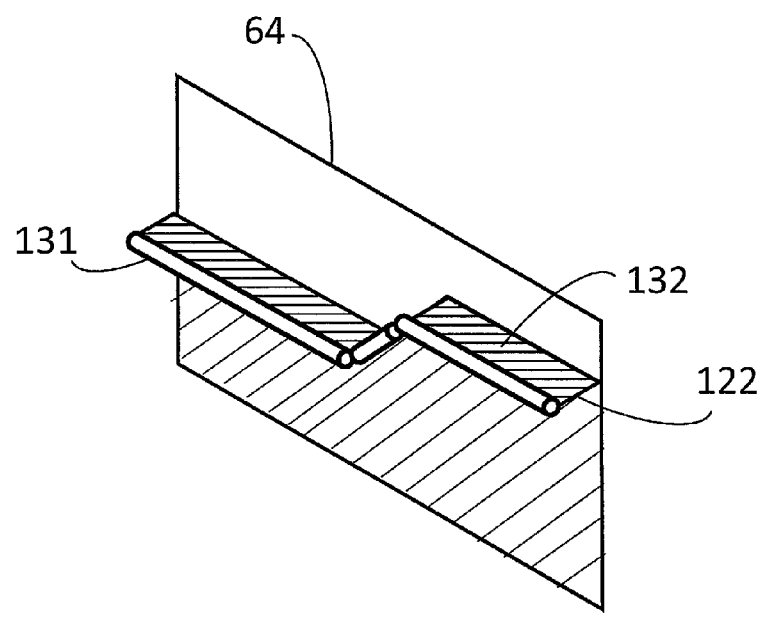
FIG. 13: further embodiment of the present invention, dividing wall with phosphor on top.

FIG. 13 shows a further embodiment of the present invention whereby fluorescent material 131 is located on top of the dividing wall 122 on the light source 64. By this configuration, emission of light of the second waveband may occur from the fluorescent material 131 on top of the dividing wall 122 and prevent any dark regions from being formed within the far-field beam spot distribution which may be associated with the presence of the dividing wall 122. The fluorescent material 131 is illustrated as a tube, but it is not necessary to the invention if the fluorescent material overhangs the sides 132 of the dividing wall 122, it is only for illustrative purposes.

Figure 14:
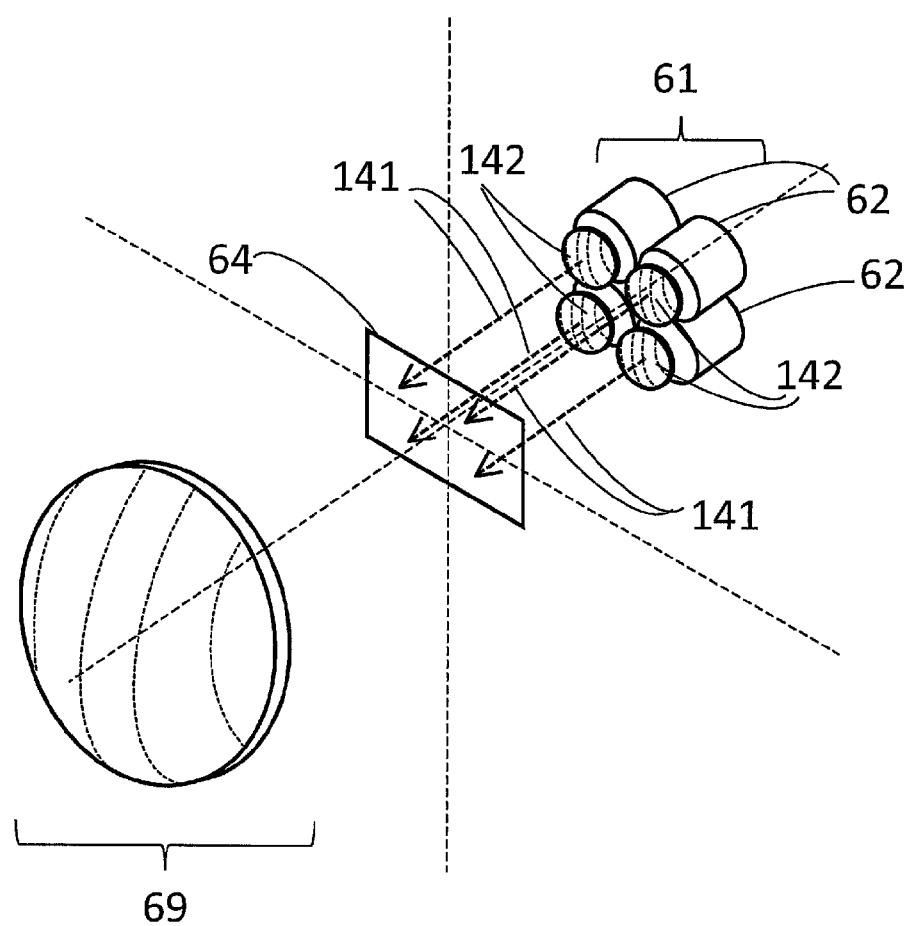
FIG. 14: further embodiments of the present invention, delivery of laser light by individual lenses.

FIG. 14 demonstrates a further embodiment of the present invention whereby the light emitted 141 from the laser emitters 62 is controlled by individual lenses 142 located in front of each laser emitter 62. The lenses do not need to be the same geometry across the group of laser emitters 61 and can be provided so as to create all of the possible configurations of illuminations spots upon the light source 64 as described in previous embodiments. Therefore, the lenses 142 geometry may be one of, but not limited to, plano-convex, bi-convex, plano-concave, bi-concave with spherical, cylindrical or aspheric cross section of curvature. Optical system 69 shown for reference.

Figure 14A:
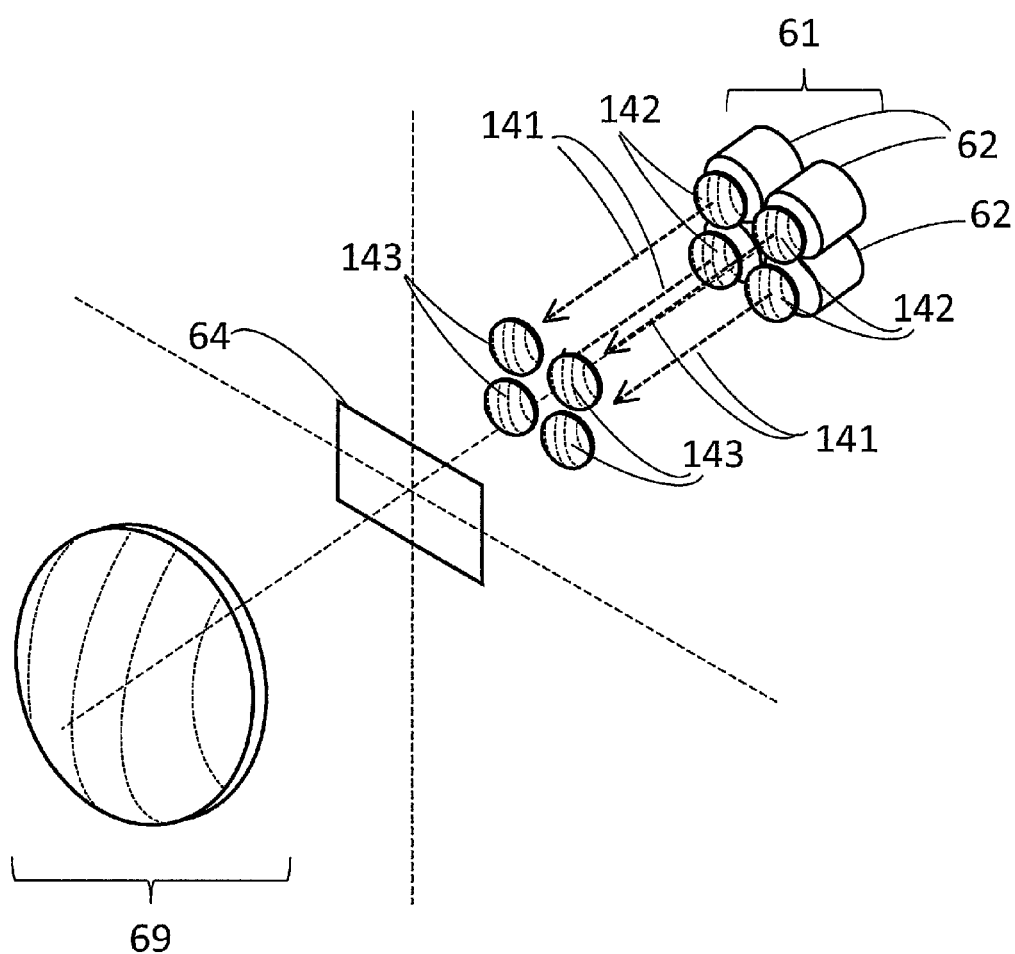
FIG. 14a: further embodiments of the present invention, delivery of laser light by individual lenses.

FIG. 14a demonstrates a further embodiment of the present invention whereby the light emitted 141 from the laser emitters 62 is controlled by individual lenses 142 located in front of each laser emitter 62 before propagating onto a second set of secondary individual lenses 143. The purpose of the dual lens arrangement is to give more control over the distribution within the beams of the emitted light 141. For example, the lens system, comprising lenses 142 and 143, may be configured to alter the magnification of the illumination spot on the light source 64 created by the lasers, or it may control the shape of the illumination spot on the light source 64, or even the distribution within the illumination spot on the light source 64. The variation in shape, size and distribution is described in previous embodiments.

Figure 15:
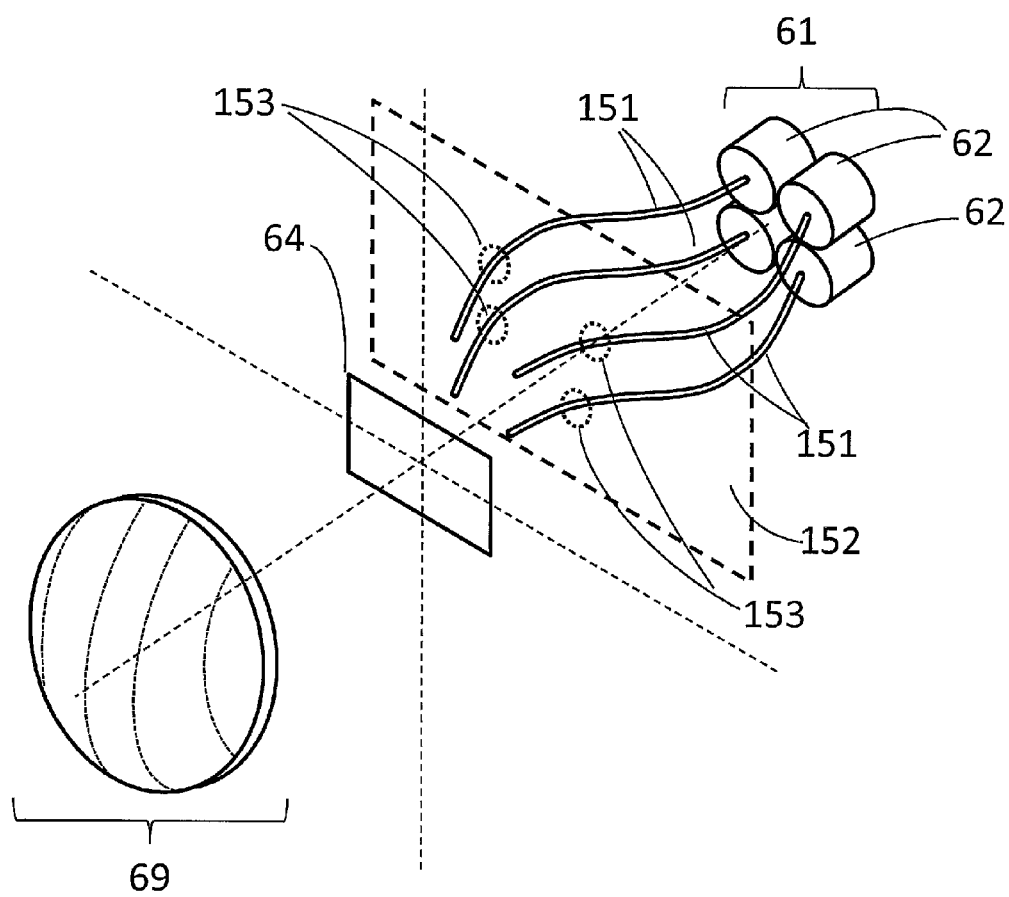
FIG. 15: further embodiment of the present invention, delivery of laser light by optical fibre.

FIG. 15 shows a further embodiment of the current invention, whereby light emitted from the laser emitters 62 is transmitted by a plurality of optical fibres 151 to the light source 64. The optical fibres 151 allow for remote location of the group of laser emitters 61 with respect to the light source 64. Indeed, the group of laser emitters 61 may be located outside of the headlight unit cavity, the edge of which is denoted by the dashed parallelepiped shape 152, and the optical fibres 151 pass through access ports 153. The optical system 69 is shown for reference. The distance between the laser emitters 62 and the light source 64 is only limited by the length over which the light can be effectively transmitted by the fibres and may encompass the range of at least 0.02 m to 10 m. The fibres themselves may have a cross-section shape which is conducive to reproducing any of the illumination spot shapes on the light source 64 as discussed in any of the preceding embodiments, for example, but not limited to, circular, oval, triangular, square etc. The optical fibres may equally be formed from light guide type structures, the distinction between the two optical fires and light guides being the presence of a cladding layer or not. As both light guides and optical fibres are well known they will not be further described herein.

Figure 16:
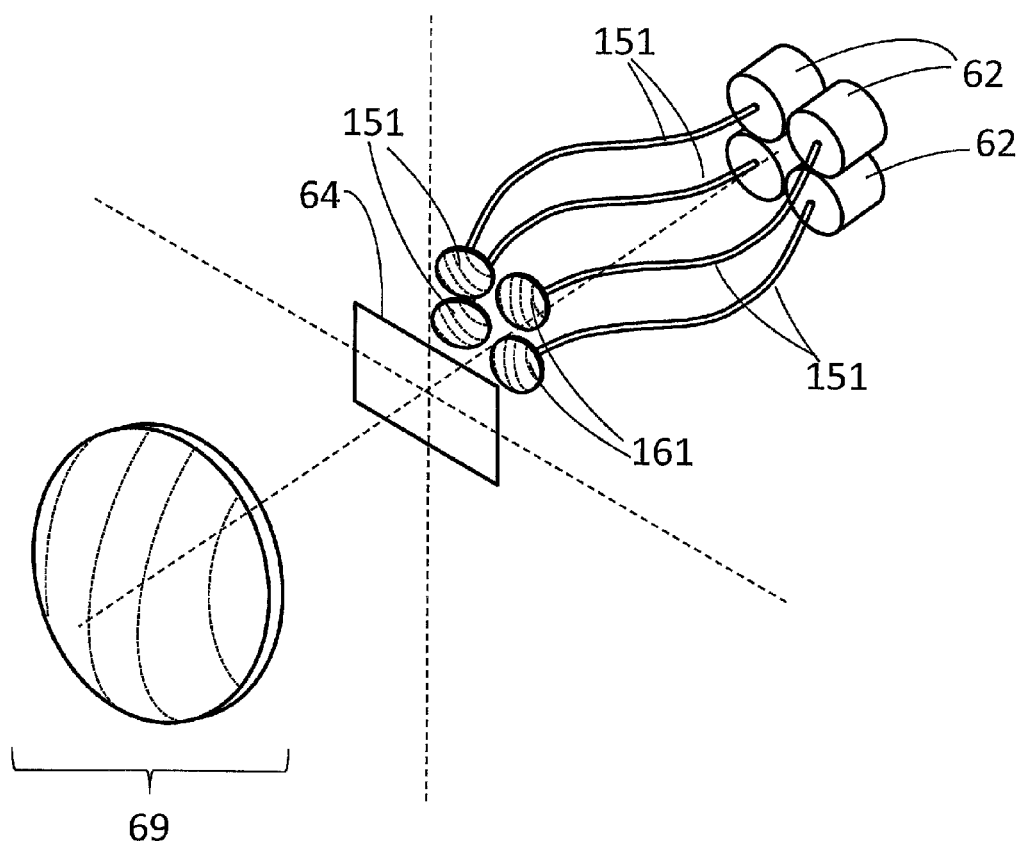
FIG. 16: further embodiment of the present invention, delivery of laser light by optical fibre and individual lenses.

FIG. 16 illustrates a further embodiment of the present invention whereby individual lenses 161 are located at the output of the optical fibres 151 for the purposes of controlling the emitted light. The lenses 161 control the emitted light so as to create any of the illumination spot shapes, sizes and arrangements as described in previous embodiments, thereby having any geometry necessary to perform that control. The light source 64, laser emitters 62 and optical system 69 are shown for reference.

Figure 17:
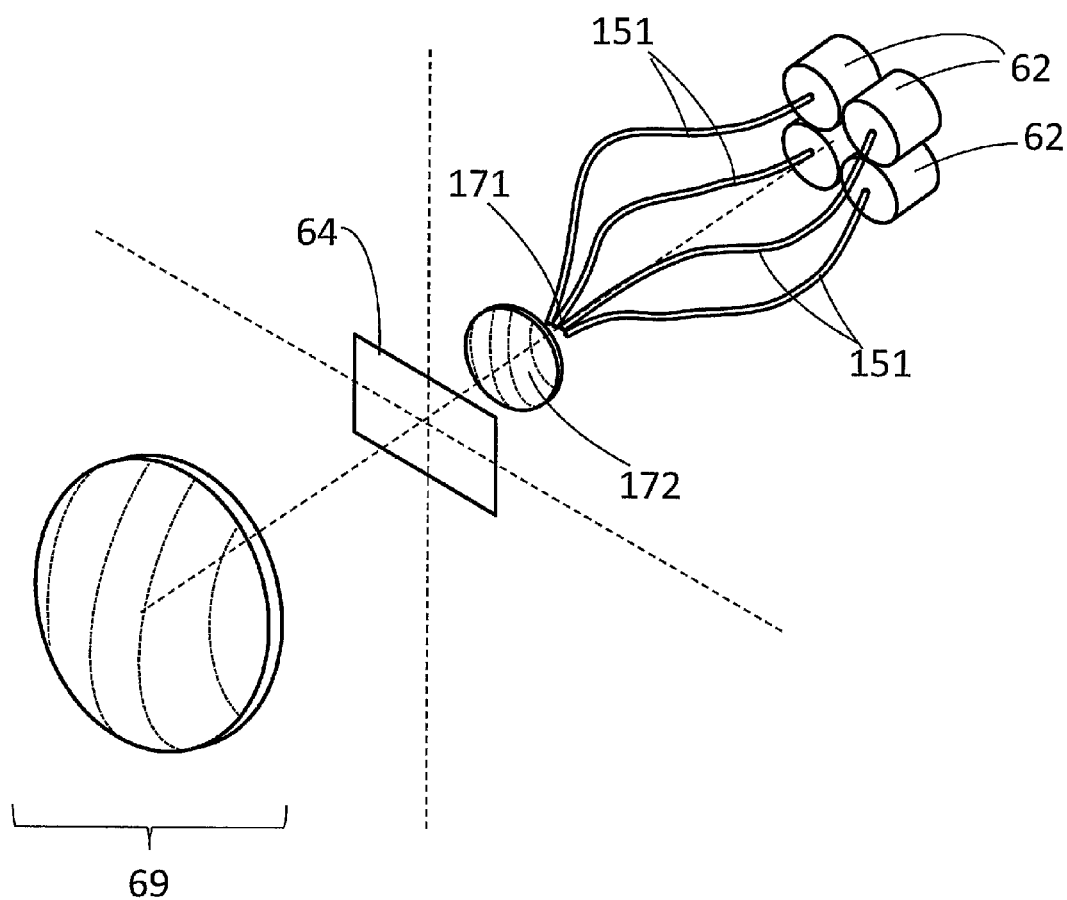
FIG. 17: further embodiment of the present invention, delivery of laser light by optical fibre and single lens.

FIG. 17 illustrates a further embodiment of the present invention whereby the optical fibres 151 are grouped into an array 171 at the end closest to the light source 64, a large single lens 172 is used to image the array 171 onto the light source. The configuration of the array 171 may be such that it forms any of the illumination spot shapes, sizes and arrangements described in previous embodiments. The light source 64, laser emitters 62 and optical system 69 are shown for reference.

Figure 17A:
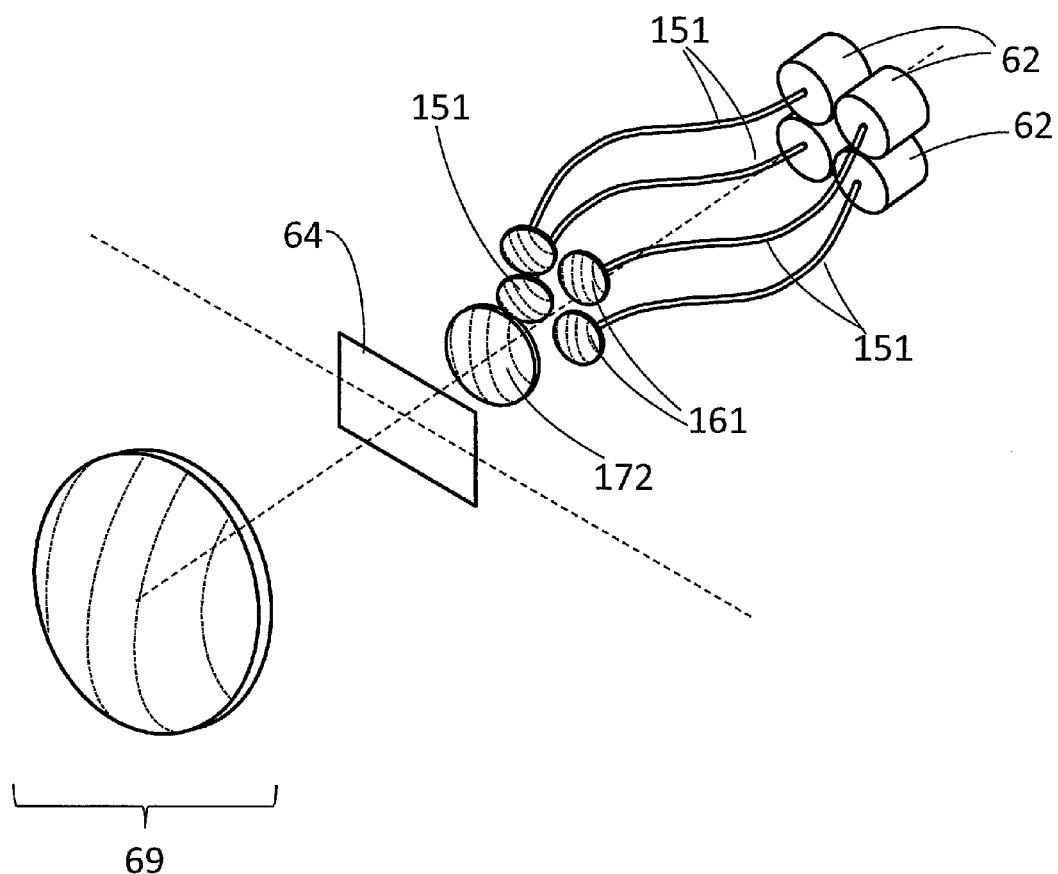
FIG. 17a: further embodiment of the present invention, delivery of laser light by optical fibre and single lens.

FIG. 17a illustrates a further embodiment of the invention whereby the optical fibres 151 are imaged through individual lenses 161 onto the focal plane of a single large lens 172. The single large lens 172 images the focal plane onto the light source 64. By this method an illumination pattern may be achieved on the light source 64 which is controlled by the shape of the fibre cores and additionally more control over the magnification of the cores of the optical fibres 151 may be achieved. The cores may be any of, but not limited to, the following shapes; square, rectangular, triangular, oval or circular. The single large lens 172 may be replaced by multiple smaller lenses if required, in a similar arrangement to that shown in FIG. 14a.

Figure 18:
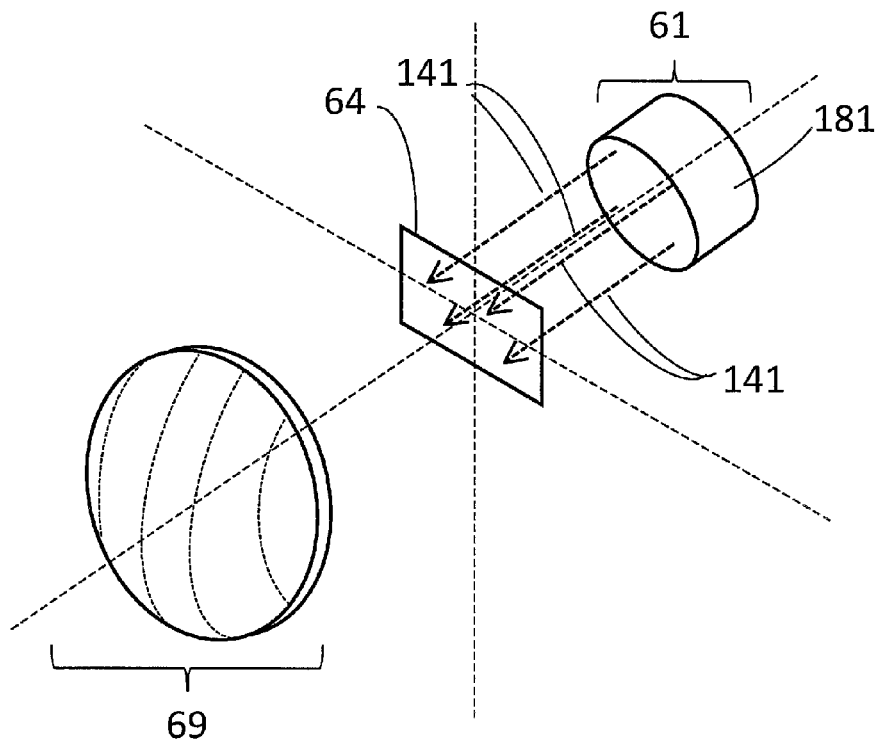
FIG. 18: further embodiment of the present invention, a laser array within a single large enclosure.

FIG. 18 illustrates a further embodiment of the present invention whereby the group of laser emitters 61 is located within one single enclosure 181, as opposed to many individual emitters located within individual enclosures. Each laser emitters within the enclosure 181 emits a distinct light beam 141 of the first waveband. The control of the light emitted from the laser emitters within the single enclosure 181 may be controlled by any of the methods described in the preceding embodiments. The number of laser emitters per enclosure and the total number of enclosures may vary depending on the preferred geometry selected during the headlight unit design process and is not limited to the two instances described in this invention. The light source 64 and optical system 69 are shown for reference.

Figure 19:
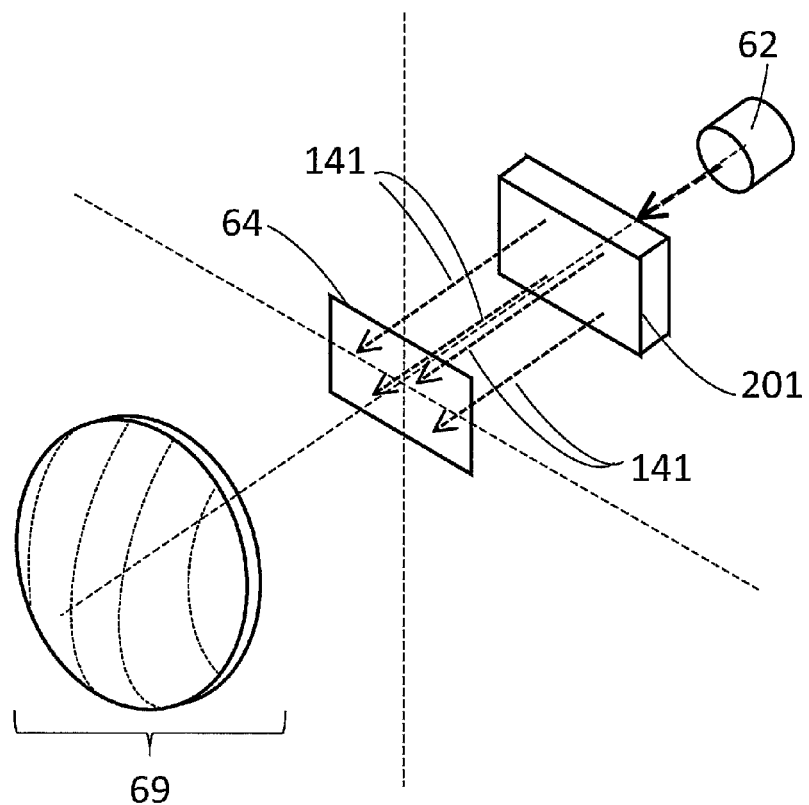
FIG. 19: further embodiment of the present invention, a single laser emitter providing multiple laser beams from a control unit.

FIG. 19 illustrates a further embodiment of the present invention whereby light emitted from a single laser emitter 62 is split into multiple laser beams 141, by a control unit 201, the laser beams 141 then being directed onto the light source 64 in such a manner as to create any of the arrangements of illumination spots as described in previous embodiments. The method of splitting the single laser beam may be, by way of example, via partially reflective beam splitters, micro electromechanical devices etc. These are well known. The optical system 69 is shown for reference. The multiple laser beams are independently controllable from one another, in their direction and/or in their intensity.

Figure 20:
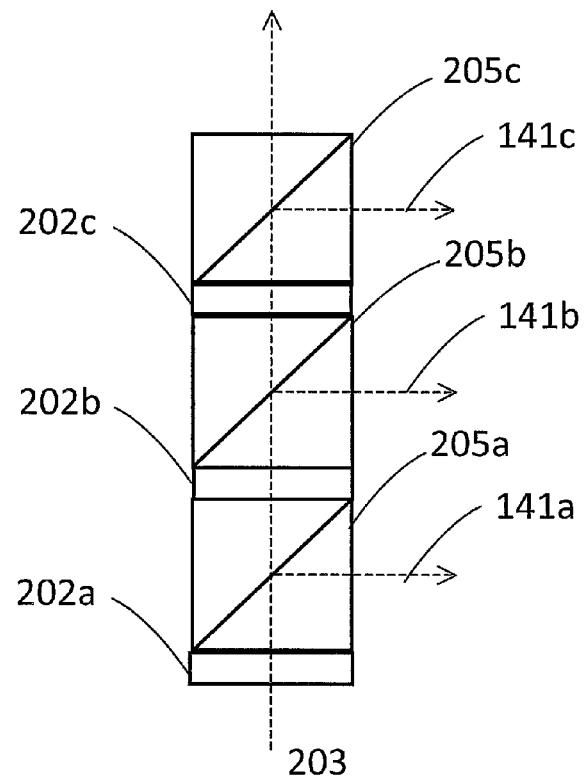
FIG. 20: a possible application of the beam splitting system from FIG. 19.

FIG. 20 illustrates a possible arrangement to split the laser beam 203, suitable for use in the embodiment of FIG. 19. In this it is assumed that the laser is polarised in a vertical (or horizontal) plane. Most lasers are already largely polarised and the use of a polarizer to clean the polarisation state is optional (not shown in the diagram). The beam passes through a voltage controlled half wave plate (such as a liquid crystal cell) 202a, b, c and the voltage on the cell will change the polarisation state from vertical to horizontal. Polarising beam splitters 205a,b,c will reflect the beam out of the system if the laser polarisation is in the appropriate state. The voltage on the LC cells can be cycled alternately in time to out-couple the light 141a,b,c in turn.

Figure 21:
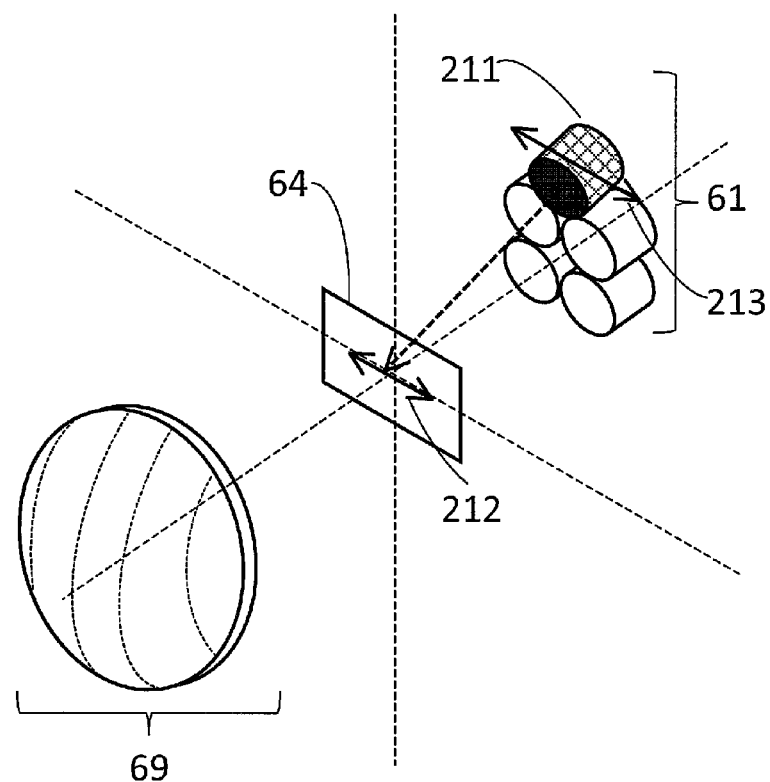
FIG. 21: further embodiment of the present invention, a moveable laser emitter within an array of otherwise static laser emitters.

FIG. 21 illustrates a further embodiment of the present invention whereby a moveable laser emitter 211 is incorporated into the group of laser emitters 61. This moveable laser emitter 211 is included to allow for further control of the illumination of the light source 64. The relation of the illumination 212 on the light source 64 is directly correlated to the movement 213 of the moveable laser emitter 211. The control of the emitted laser light may also be that disclosed in previous embodiments. The optical system 69 is shown for reference.

Figure 22:
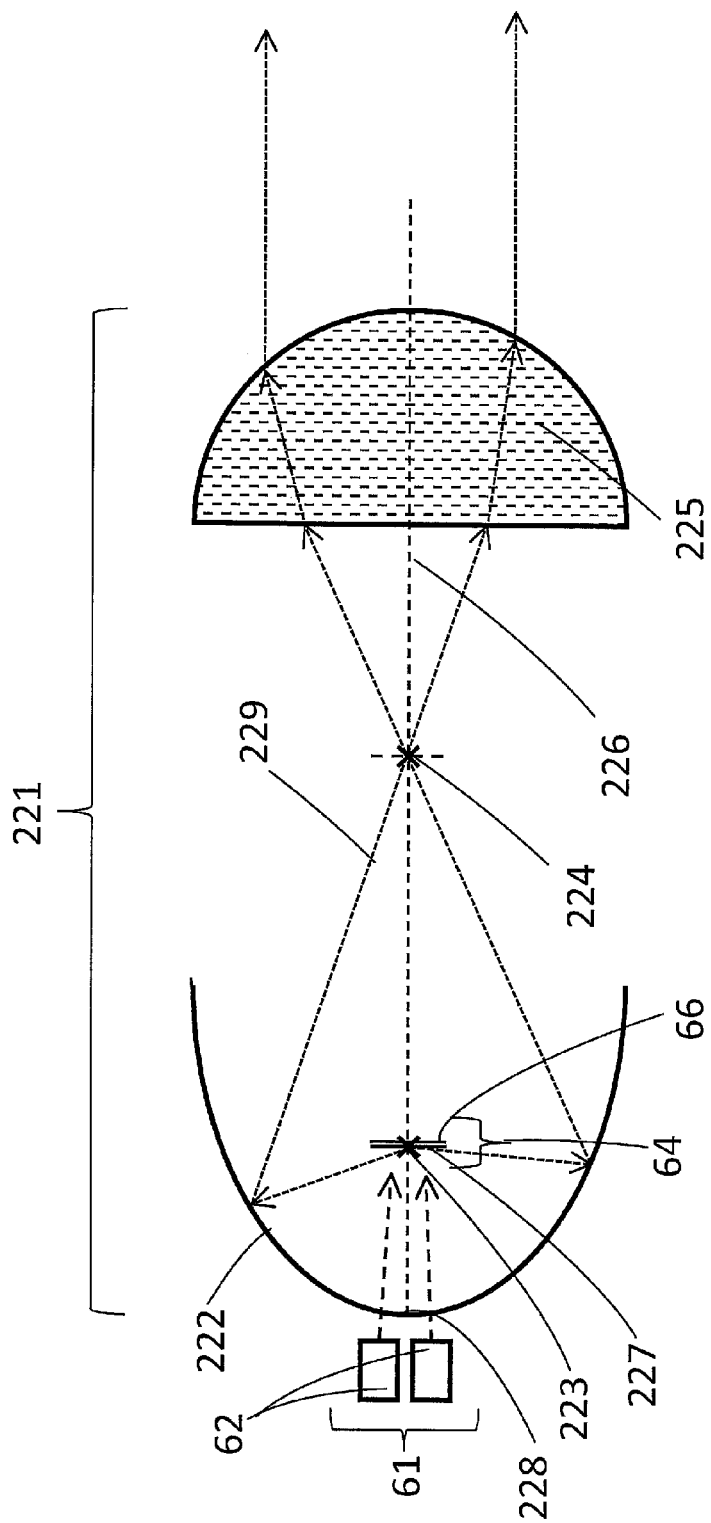
FIG. 22: further embodiment of the present invention, side view of a projector unit configuration, elliptical reflector and lens.

FIG. 22 illustrates a further embodiment of the present invention whereby the headlight unit is formed from a reflector and lens based projection unit 221 formed upon the basis of an elliptical reflector 222. The light source 64 is located at the first focal point 223 of the elliptical reflector 222 and orientated such that the optical axis 226 of the projection unit 221 is normal to the light source 64 surface 227 and the fluorescent material on the light source surface 227 is facing the reflector apex 228. The substrate 66 is made reflective and located on the opposite side of the light source 64 to the reflector apex 228. In this arrangement maximum emission of light occurs toward the reflector apex 228 and maximises the collection efficiency of the reflector 222. The above arrangement also provides optimal conditions for imaging of the brightness distribution upon the surface 227 of the light source 64 into the far-field. The light emitted from the light source 64 is directed through the second focal point 224. The light emitted 229 passes through the second focal point 224 and this second focal point 224 is imaged by a lens 225 into the far-field (optionally, the lens 225 may have its focal point coincident or substantially coincident with the second focal point 224 of the reflector 222. The light source 64 is illuminated by a group 61 of laser emitters 62 located outside of the elliptical reflector 222. This arrangement has advantage over other existing light sources in that halogen or HID xenon bulbs have an approximately isotropic emission and cannot be imaged by this arrangement so efficiently, LED light sources have a large heat-sink that prevents the particular source orientation described above being achieved. Therefore, this configuration is thought to be only possible with a laser based light source, such as that described in this present invention.

Figure 23:
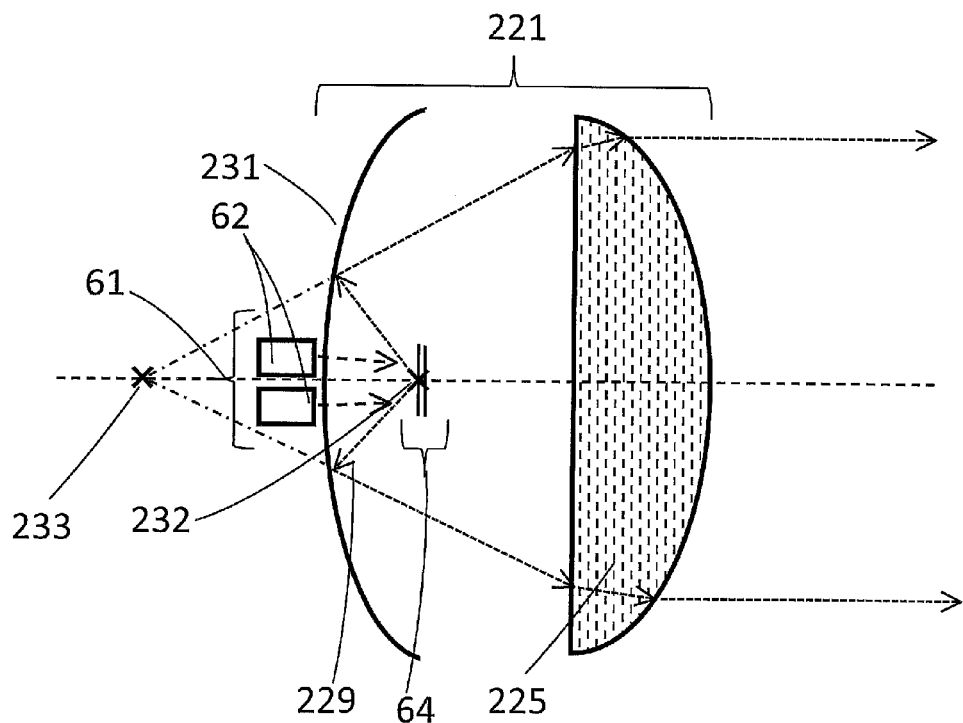
FIG. 23: further embodiment of the present invention, side view of a projector unit configuration, hyperbolic reflector and lens.

FIG. 23 illustrates a further embodiment of the present invention whereby the headlight unit is formed from a reflector and lens based projection unit 221 formed upon the basis of a hyperbolic reflector 231. The light source 64 is located at the first focal point 232 of the hyperbolic reflector 231. The light source 64 is orientated in the same arrangement as described in the previous embodiment. The light emitted 229 from the light source 64 is reflected from the hyperbolic reflector 231 such that it appears to have originated from the second focal point 233. The lens 225 is located such that its focal point is coincident with the second focal point, thereby imaging the light that appears to come from the second focal point 233. The light source 64 is illuminated by a group 61 of laser emitters 62 located outside of the hyperbolic reflector 231.

Figure 24:
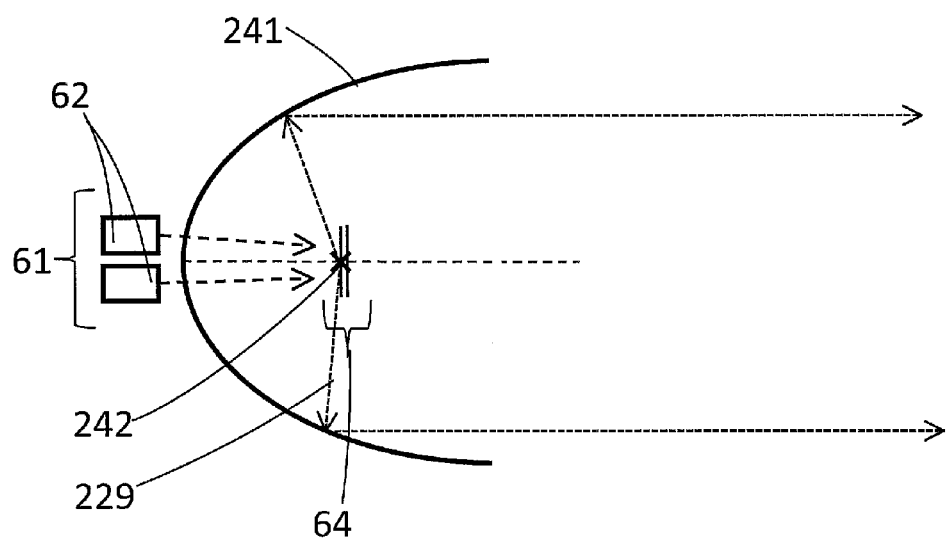
FIG. 24: further embodiment of the present invention, side view of a projector unit configuration, parabolic reflector.

FIG. 24 illustrates a further embodiment of the present invention whereby the headlight unit is formed from a single parabolic reflector 241. The light source 64 is located at the focal point 242 of the parabolic reflector 241. The light source 64 is arranged in the same manner as described in the previous embodiment. The light emitted 229 from the light source 64 is collimated into the far-field by the parabolic reflector 241. The light source 64 is illuminated by a group 61 of laser emitters 62 located outside of the parabolic reflector 241.

Figure 25:
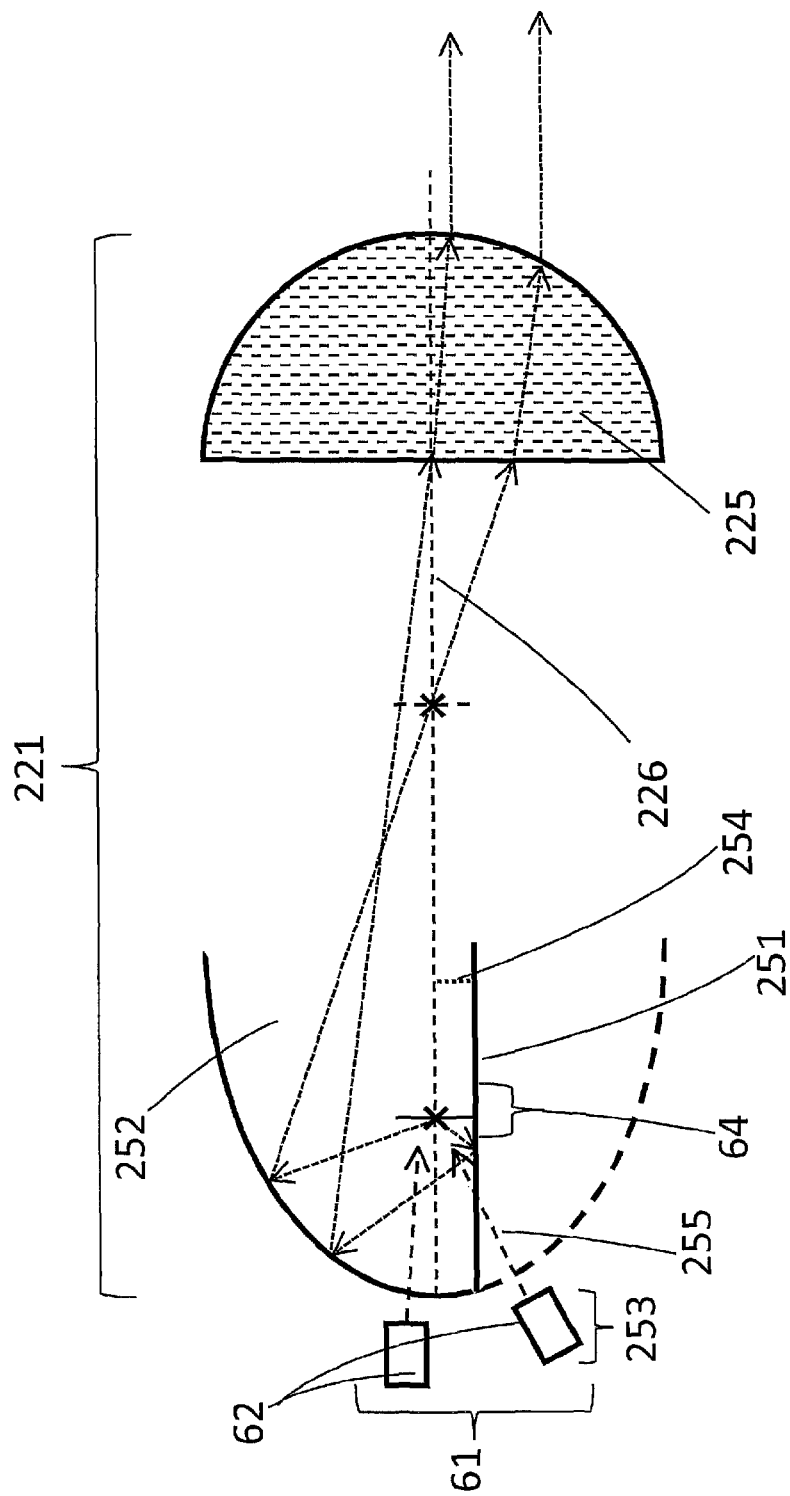
FIG. 25: further embodiment of the present invention, side view of a projector unit configuration, truncated reflector cavity.

FIG. 25 illustrates a further embodiment of the present invention whereby the reflector of the headlight unit is reduced in size. A projection unit 221 is shown as per FIG. 22. But in contrast, a flat surface 251 is inserted into the reflector cavity 252 such that the flat surface is arranged parallel to the optical axis 226, but spatially separated 254 from the optical axis 226. The flat surface 251 is separated from the optical axis 226 by a distance 254 equivalent to the dimensions of the light source 64 located on the same side of the optical axis 226. By this arrangement the light source 64 may be thought of as resting on the flat surface 251. The flat surface 251 is opaque and may be made from a material which is reflecting or absorbing to the light of either or both of the first and second wavebands. The laser emitters 62 are once again located outside of the reflector cavity 252, but some laser emitters 62 may be arranged 253 below the flat surface 251 to direct light 255 of the first waveband through the flat surface 251, via a port or similar aperture. The lens 225 utilised within this configuration is not divided by the flat surface 251. The projection unit illustrated is an elliptical profile, but the any of the configurations disclosed in the preceding embodiments may be similarly modified.

Figure 26:
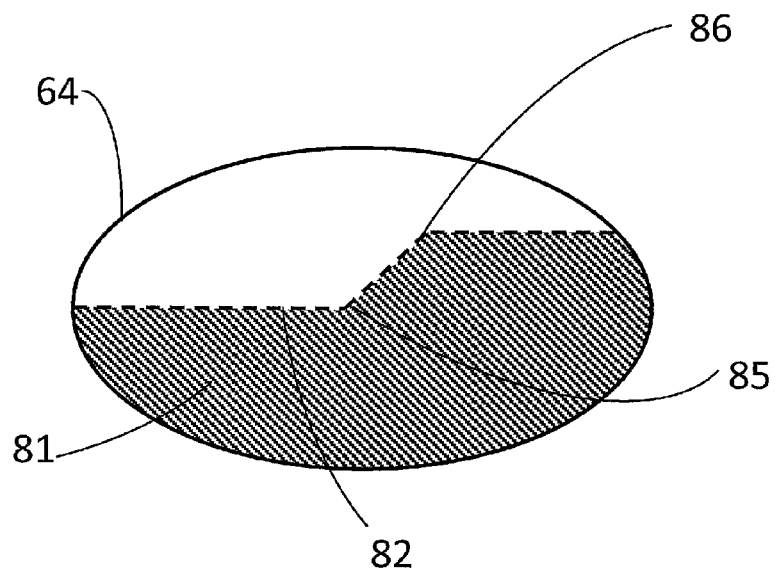
FIG. 26: further embodiment of the present invention, plan view of the light source with different shape.

FIG. 26 shows a further configuration of the present invention whereby the light source 64 is formed from a shape other than rectangular, as has been shown in all preceding embodiments. Another shape may be chosen which is better suited to the optical system or required beam spot geometry in the far-field. In this instance the light source 64 is shown as being oval in shape. The primary illumination distribution 81 with cut-off line 82, elbow 85 and shoulder 86 are also shown for reference. The invention should not be limited to this shape and could include by way of example, but not intended as a complete listing of all possible shapes, triangular, square, pentagonal and upwards in side number, or racetrack, irregular, bowtie, hourglass etc.

Figure 27:
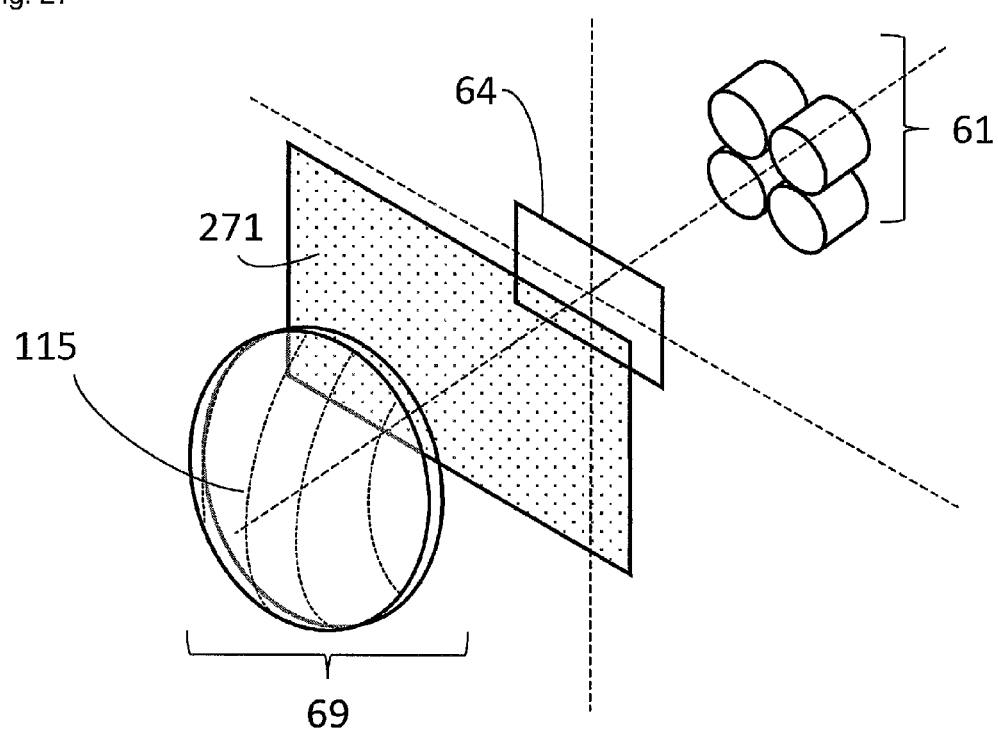
FIG. 27: further embodiment of the present invention, provision of a wavelength selective filter to block light of the first waveband.

FIG. 27 shows a further embodiment of the present invention whereby a wavelength selective filter 271 is inserted into the optical system 69 after the light source 64 and before the exit aperture 115 of the headlight unit. The purpose of the wavelength selective filter 271 is to prevent the emission from the laser emitter of the first waveband, which is not converted to light of the second waveband by the fluorescent material of the light source 64, exiting the headlight unit through the exit aperture 115. This is only applicable if the light from the first waveband has low visibility to the human eye and therefore does not contribute significantly to the perceived brightness of the headlight unit. Such wavelengths may be considered as being shorter than 415 nm. Wavelengths which are greater than 415 nm may be considered as contributing to the human eye response and therefore should not be blocked by such a wavelength selective filter 271. The group of laser emitters 61 is shown for reference.

Figure 28:
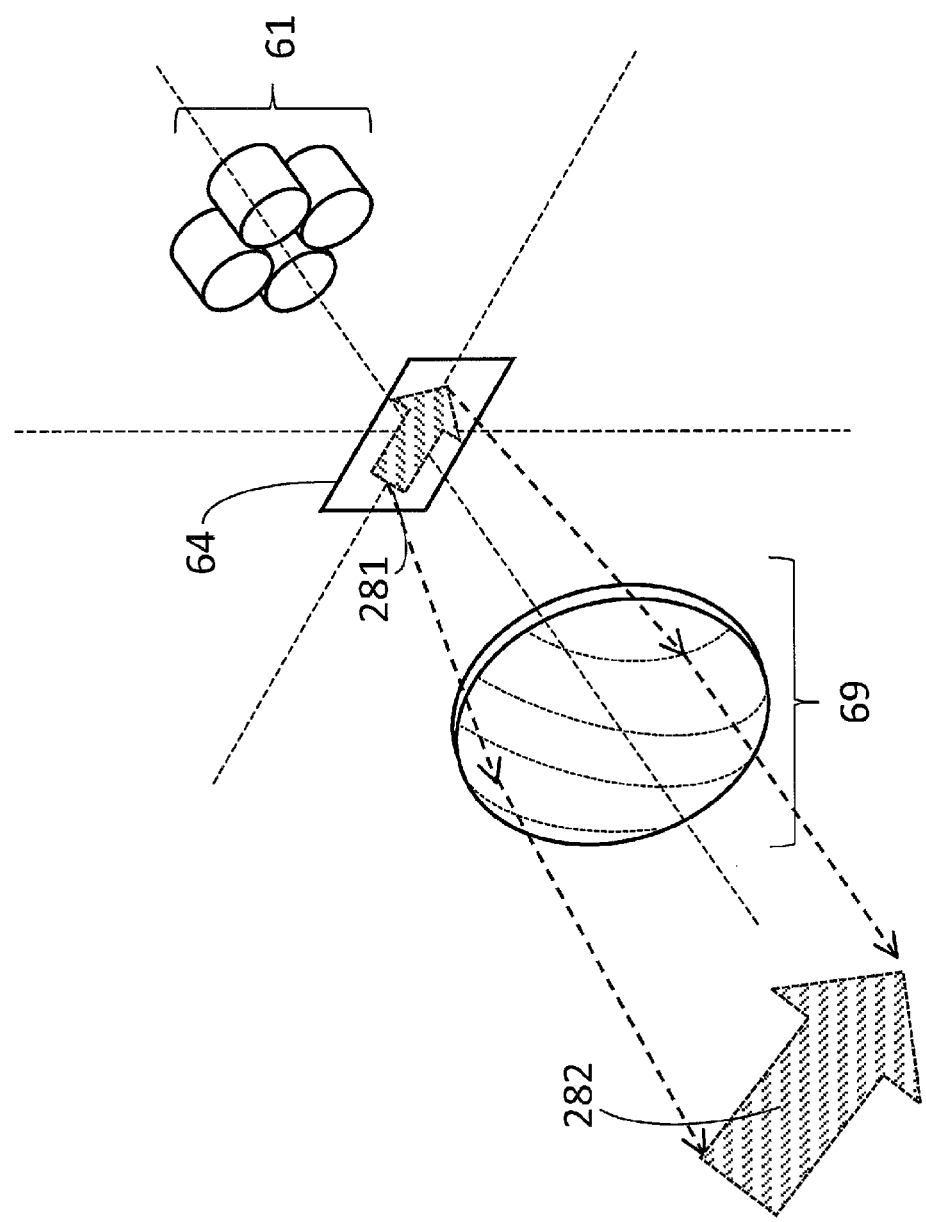
FIG. 28: further embodiment of the present invention, provision of information within the beam spot.

FIG. 28 illustrates a further embodiment of the present invention whereby the configuration of the illumination distribution on the light source 64 may be used to generate a patterned output such that the beam spot distribution on the road can be used to convey information to the driver of the automobile or to other road users. In this example, an arrow shape 281 is created on the light source 64 by the array of laser emitters 61. The arrow shape 281 is projected through the optical system 69 to form a larger arrow shape 282 on the far-field beam spot distribution on the road. In this example the larger arrow shape 282 is the only artefact within the beam spot, however it is possible that the arrow shape 282 may be created in addition to the normal beam spot distribution, equally it may be subtracted from the usual beam spot distribution. Both forms will act to convey information within the normal beam spot distribution. The information conveyed need not be limited to arrows. Indeed, it is expected that the information could include shapes to indicate a hazard, for example a triangle or spot light, or could even convey written messages.

Figure 29:
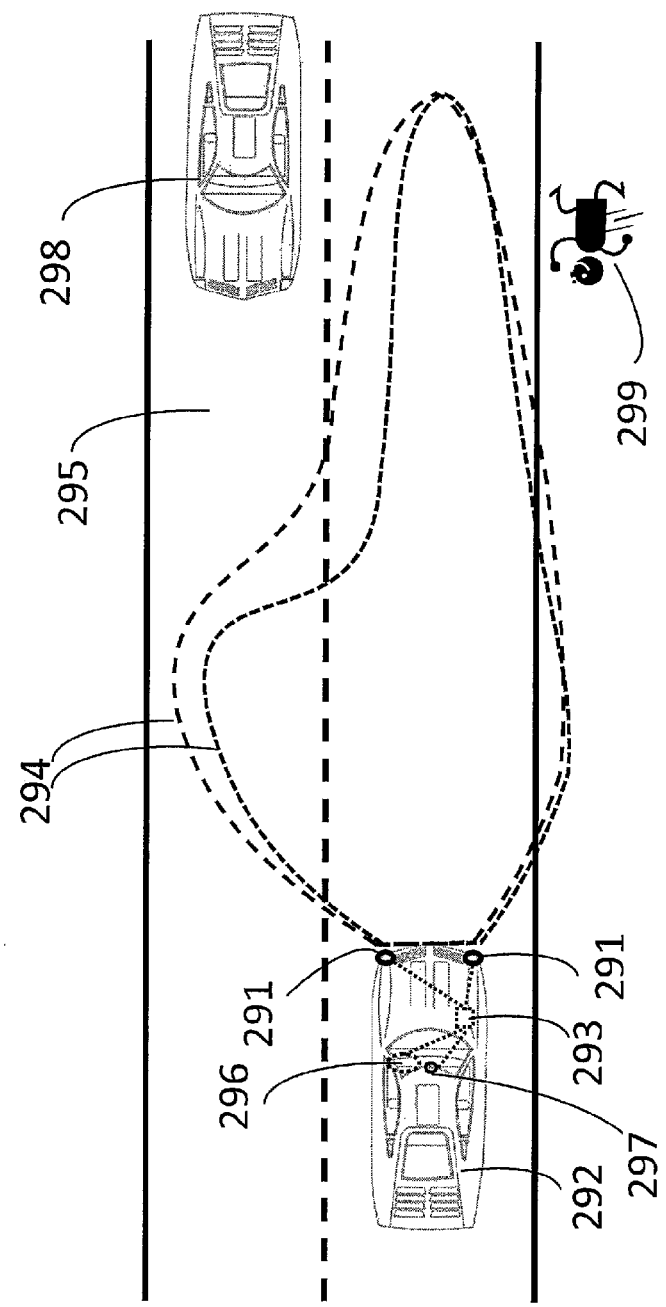
FIG. 29: system overview of the present invention.

FIG. 29 shows a system view of the headlight unit 291 within an automobile 292. The headlight units 291 are controlled by a central control unit 293. The control unit changes the output from the headlight units 291 to alter the beam spot distribution 294 on the road 295 in response to input from either the driver console 296 or a signal from an automatic system which detects the conditions of the road 295, e.g. a camera 297. The beam spot may be modified to account for the presence of oncoming automobiles 298 or other hazards, for example a pedestrian 299 about to enter the road 295.

Although the invention has been shown and described with respect to a certain embodiment or embodiments, equivalent alterations and modifications may occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein exemplary embodiment or embodiments of the invention. In addition, while a particular feature of the invention may have been described above with respect to only one or more of several embodiments, such feature may be combined with one or more other features of the other embodiments, as may be desired and advantageous for any given or particular application.

A light beam generator of the invention may comprise a plurality of independently controllable semiconductor light emitting devices spatially separated from the photoluminescent material, each generating a respective beam.

The light beam generator may comprise a beam splitter for generating a plurality of independently controllable light beams from a light beam incident on the beam splitter.

The light beam generator may comprise at least one light emitting device having a controllable direction of light emission.

The light source system may further comprise an optical system arranged to image light emitted from the photoluminescent material into the far field.

The semiconductor light emitting device(s) may be laser emitter(s) or they may be light emitting diode(s).

In the first mode, the light beam generator may be arranged to generate light beams for illuminating a first region of the photoluminescent material but not for illuminating a second region of the photoluminescent material.

In the second mode, the light beam generator may be arranged to generate light beams for illuminating the first region of the photoluminescent material and for illuminating a third region of the photoluminescent material.

The third region may overlap with the first region.

In the second mode, the light beam generator may be arranged to generate light beams for illuminating part of the first region with an intensity different to the intensity of illumination of the part of the first region in the first mode.

In the second mode, the light beam generator may be arranged to generate light beams for illuminating the second region.

A boundary of the first region of the photoluminescent material may pass through focal point of optical system.

The first region of the photoluminescent material and the second region of the photoluminescent material may lie in a common plane.

Alternatively, the first region of the photoluminescent material may be displaced relative to the second region of the photoluminescent material along an optical axis of the optical system. The first region may be displaced so as to be nearer the light beam generator, or further from the light beam generator, than the second region.

The light source system may further comprise a wall disposed along a boundary between the first region of the photoluminescent material and the second region of the photoluminescent material, the wall extending generally perpendicular to a surface of the photoluminescent material.

Photoluminescent material may be disposed on at least part of the wall. It may be disposed on a distal edge of the wall.

Areas of the photoluminescent material illuminated by each light beam may have substantially the same shape as one another. For example, they may be oval, or rectangular. Alternatively, the regions of the photoluminescent material may include regions of different shapes to one another.

Areas of the photoluminescent material illuminated by each light beam may have substantially the same size as one another. Alternatively, the areas may include areas of different sizes to one another.

Areas of the photoluminescent material illuminated by each light beam may have substantially the same orientation as one another. Alternatively, the areas may include areas of different orientations to one another.

Each of the light emitting devices may be associated with one or more respective lenses.

Each of the light emitting devices may be associated with a respective light guide for guiding light from the light emitting device towards the photoluminescent material. For the avoidance of doubt, the term "light guide" as used herein includes any structure suitable for guiding light such as, for example, an optical fibre.

The light source system may comprise one or more lenses for imaging light exiting the light guides onto the photoluminescent material.

Where the light source system comprises an optical system, the optical system may comprise a projection lens.

The optical system may comprise a reflector for reflecting light emitted by the photoluminescent material towards the projection lens.

The reflector may be a hyperbolic reflector, the photoluminescent material may be disposed substantially at a first focal point of the hyperbolic reflector, and the focal point of the projection lens may be substantially coincident with a second focal point of the hyperbolic reflector. Alternatively, the reflector may be a parabolic or elliptical reflector.

The reflector may comprise a planar surface extending substantially parallel to the optical axis of the optical system.

A second aspect of the invention provides a headlight for a motor vehicle comprising a light source system of the first aspect.

The first far-field illumination pattern may provide a dipped beam. That is, the first region of photoluminescent material may be so shaped, and so positioned, that it is imaged by the optical system to provide a far field illumination pattern corresponding to the illumination pattern that is required for a "dipped" beam of a vehicle headlight.

The second far-field illumination pattern may provide a driving beam. That is, the region of photoluminescent material that is illuminated in the second mode may be so shaped, and so positioned, that it is imaged by the optical system to provide a far field illumination pattern corresponding to the illumination pattern that is required for a "driving" beam of a vehicle headlight.

A third aspect of the invention provides a vehicle comprising a headlight of the second aspect.

INDUSTRIAL APPLICABILITY

The present invention can be applied to the automotive industry and more specifically the provision of advanced adaptive front lighting systems to the headlights of automobiles.

REFERENCE SIGNS LIST 11. light emitting element (prior art 1)
12. laser chips (prior art 1)
13. light guide irradiation members (prior art 1)
14. reflecting mirror (prior art 1)
15. laser chip group (prior art 1)
21. lamp for a vehicle (prior art 2)
22. LED light sources (prior art 2)
23. phosphor (prior art 2)
24. shade (prior art 2)
25. convex lens (prior art 2)
31. solid state light source (prior art 3)
32. fluorescent material layer (prior art 3)
33. reflective method (prior art 3)
34. optical system (prior art 3)
41. secondary light source (prior art 4)

42. optical distribution element (prior art 4)
43. principal lens (prior art 4)
44. laser diode (prior art 4)
45. obscuring part (prior art 4)
51. lamp module (prior art 5)
52. fluorescent substance (prior art 5)
53. light emission parts (prior art 5)
54. micro lenses (prior art 5)
61. group of laser light sources
62. individual laser emitters
63. light beams of the first waveband
64. light source
65. fluorescent material
66. substrate
67. illumination spots
68. secondary light
69. optical system
610. primary lens
611. array
612. array boundaries
613. heat sink
71. oval illumination spots
72. overlapping illumination spots
73. freeform illumination distribution
74. vertical illumination spot
75. diagonally arranged illumination spot
76. smaller illumination spots
77. rectilinear illumination spots
78. triangular illumination spots
79. smaller illumination spots enclosed by larger ones
710. larger illumination spots enclosing smaller ones
711. composite illumination spot
712. region near the middle of the composite illumination spot
713. region near the edge of a composite illumination spot
81. primary illumination region
82. cut-off line
83. high brightness region
84. low brightness region
85. elbow
86. shoulder
87. far-field brightness distribution
88. far-field cut-off
89. far-field elbow
810. far-field shoulder
811. vertical axis
812. horizontal axis
813. secondary illumination distribution
814. overlap region
815. combined beam spot
816. new region of the beam spot
817. brighter region of the beam spot
818. straight sections of line
91. curves forming the cut-off line
101. focal point
111. remainder
112. optical axis
113. distance along the optical axis
114. radius of the optical system
115. exit aperture of the optical system
116. first cluster of laser emitters
117. second cluster of laser emitters
118. third cluster of laser emitters
119. division line
121. planar piece
122. dividing wall
123. face of the light source
124. area of light source underneath the dividing wall
125. area of light source above the dividing wall
126. plan view of light source
127. side view of light source
131. fluorescent material on top of the dividing wall
132. sides of the dividing wall
141. light from the laser emitters
141a,b,c Light split into controllable elements from a single laser
142. lenses
143. secondary individual lenses
151. optical fibres
152. dashed parallelepiped
153. access ports
161. individual lenses for optical fibres
171. array of optical fibres
172. large single lens
181. one single enclosure
201. laser control unit
203. Laser beam from laser
202a,b,c LC voltage controlled half wave plates
205a,b,c Polarising beamsplitters
211. moveable laser emitter
212. movement of the illumination upon the light source
213. movement of the laser emitter
221. projection unit
222. elliptical reflector
223. first focal point of the elliptical reflector
224. second focal point of the elliptical reflector
225. lens
226. optical axis of the projection unit
227. surface of the light source
228. reflector apex
229. light emitted from light source
231. hyperbolic reflector
232. first focal point of the hyperbolic reflector
233. second focal point of the hyperbolic reflector
241. parabolic reflector
242. focal point of the parabolic reflector
251. flat surface
252. reflector cavity
253. laser emitters arranged below the flat surface
254. distance below optical axis
255. light from below the flat surface
261. total fluorescent area
271. wavelength selective filter
281. arrow shape
282. larger arrow shape
291. headlight unit
292. automobile
293. central control unit
294. beam spot distribution on the road
295. road
296. driver console
297. camera
298. oncoming automobile
299. person

The invention claimed is:

1. A light source system operable in at least first and second modes to provide at least and first and second different far field illumination patterns, the system comprising:
a photoluminescent material; and
a light beam generator for generating at least two independently controllable sets of light beams for illuminating respective fixed regions of the photoluminescent material;

wherein the light beam generator comprises a plurality of independently controllable semiconductor light emitting devices spatially separated from the photoluminescent material, each of the plurality of light emitting devices generating, in use, a respective light beam for illuminating the respective fixed regions of the photoluminescent material;

wherein, in the first mode, the light beam generator is arranged to generate light beams for illuminating a first region of the photoluminescent material but not for illuminating a second region of the photoluminescent material; and wherein, in the second mode, the light beam generator is arranged to generate light beams for illuminating the first region of the photoluminescent material and for illuminating a third region of the photoluminescent material, the third region being different from the second region.

2. A light source system as claimed in claim 1 wherein the plurality of light emitting devices includes at least one light emitting device having a controllable direction of light emission.

3. A light source system as claimed in claim 1 and further comprising an optical system arranged to image light emitted from the photoluminescent material into the far field.

4. A light source system as claimed in claim 1 wherein the third region overlaps with the first region.

5. A light source system as claimed in claim 1 wherein, in the second mode, the light beam generator is arranged to generate light beams for illuminating part of the first region with an intensity different to the intensity of illumination of the part of the first region in the first mode.

6. A light source system as claimed in claim 1 wherein a boundary of the first region of the photoluminescent material passes through a focal point of optical system.

7. A light source system as claimed in claim 1 further comprising a wall disposed along a boundary between the first region of the photoluminescent material and the second region of the photoluminescent material, the wall extending generally perpendicular to a surface of the photoluminescent material.

8. A light source system as claimed in claim 1 wherein areas of the photoluminescent material illuminated by each light beam have substantially the same shape as one another and/or have substantially the same size as one another and/or have substantially the same orientation as one another.

9. A light source system as claimed in claim 1, wherein each of the plurality of light emitting devices is associated with one or more respective lenses.

10. A light source system as claimed in claim 1, wherein each of the plurality of light emitting devices is associated with a respective light guide for guiding light from the light emitting device towards the photoluminescent material.

11. A light source system as claimed in claim 10 and further comprising one or more respective lenses for imaging light exiting the respective light guides onto the photoluminescent material.

12. A light source system as claimed in claim 3 wherein the optical system comprises a lens.

13. A light source system as claimed in claim 3 wherein the optical system comprises a reflector for reflecting light emitted by the photoluminescent material towards a projection lens.

14. A light source system as claimed in claim 13 wherein the reflector is a hyperbolic reflector, the photoluminescent material is disposed substantially at a first focal point of the hyperbolic reflector, and the focal point of the lens is substantially coincident with a second focal point of the hyperbolic reflector.

15. A light source system as claimed in claim 13 wherein the reflector comprises a planar surface extending substantially parallel to the optical axis of the optical system.

16. A headlight for a motor vehicle comprising a light source system as defined in claim 1 wherein the first far-field illumination pattern provides a dipped beam and/or wherein the second far-field illumination pattern provides a driving beam.

17. A vehicle comprising a headlight as claimed in claim 16.

18. A light source system as claimed in claim 1, wherein the different far field illumination patterns are provided based on non-mechanical control of the plurality of independently controllable light emitting devices that generate the respective light beams which illuminate, in use, the respective regions of the photoluminescent material to vary a spatial emission distribution from the photoluminescent material.

19. A light source system as claimed in claim 18, further comprising a lens;
wherein a first surface of the photoluminescent material faces toward the lens and a second surface of the photoluminescent material opposite the first surface faces toward the plurality of light emitting devices;
wherein the respective light beams from the plurality of light emitting devices are directed, in use, onto the first surface of the photoluminescent material to illuminate the respective regions of the photoluminescent material; and
wherein the photoluminescent material converts the respective light beams into secondary light that is emitted from the second surface of the photoluminescent material toward the lens for imaging the secondary light into the far field.

* * * * *